(12) United States Patent
Landis et al.

(10) Patent No.: US 11,456,403 B2
(45) Date of Patent: Sep. 27, 2022

(54) METHOD OF MANUFACTURING A MICROELECTRONIC DEVICE HAVING AN ARRAY OF INCLINED RELIEFS

(71) Applicant: COMMISSARIAT A L'ENERGIE ATOMIQUE ET AUX ENERGIES ALTERNATIVES, Paris (FR)

(72) Inventors: Stefan Landis, Grenoble (FR); Hubert Teyssedre, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 111 days.

(21) Appl. No.: 16/951,357

(22) Filed: Nov. 18, 2020

(65) Prior Publication Data
US 2021/0217937 A1    Jul. 15, 2021

(30) Foreign Application Priority Data
Nov. 18, 2019 (FR) ..................... 19 12857

(51) Int. Cl.
*G03F 7/00* (2006.01)
*G02B 5/18* (2006.01)
(Continued)

(52) U.S. Cl.
CPC ............ *H01L 33/58* (2013.01); *G02B 5/1852* (2013.01); *G02B 5/1866* (2013.01);
(Continued)

(58) Field of Classification Search
CPC ... H01L 33/58; H01L 31/02327; H01L 31/18; H01L 2933/0058; G02B 5/1852;
(Continued)

(56) References Cited

U.S. PATENT DOCUMENTS

2002/0122255 A1   9/2002 Ogusu et al.
2009/0224416 A1*  9/2009 Laakkonen ........... G03F 7/0002
                                                    264/1.38
(Continued)

FOREIGN PATENT DOCUMENTS

EP    3 078 994 A1    10/2016
JP    06-201907 A     7/1994

OTHER PUBLICATIONS

French Preliminary Search Report dated Aug. 13, 2020 in French Application 19 12857 filed on Nov. 18, 2019 (with English Translation of Categories of Cited Documents & Written Opinion), citing documents AA-AB & AO-AP therein, 11 pages.

(Continued)

*Primary Examiner* — Earl N Taylor
(74) *Attorney, Agent, or Firm* — Oblon, McClelland, Maier & Neustadt, L.L.P.

(57) ABSTRACT

A method is provided for producing a microelectronic device having a subsequent grating of reliefs of which at least one wall is slanted, the method including providing a structure including a base, and an initial grating of reliefs, each relief having at least one proximal end in contact with the base, a distal end, and at least one wall extending between the proximal end and the distal end; and laying the reliefs of the initial grating on one another, by application of at least one stress on the structure, such that walls facing two adjacent reliefs come into contact, thus generating at least one subsequent grating of reliefs of which at least one wall is slanted.

23 Claims, 16 Drawing Sheets

(51) Int. Cl.
     *H01L 33/58*      (2010.01)
     *H01L 31/0232*    (2014.01)
     *H01L 31/18*      (2006.01)

(52) U.S. Cl.
     CPC ...... *G03F 7/0002* (2013.01); *H01L 31/02327* (2013.01); *H01L 31/18* (2013.01); *H01L 2933/0058* (2013.01)

(58) Field of Classification Search
     CPC .. G02B 5/1866; G02B 5/1861; G02B 5/1857; G03F 7/0002
     See application file for complete search history.

(56) References Cited

U.S. PATENT DOCUMENTS

| | | | | |
|---|---|---|---|---|
| 2018/0081170 | A1* | 3/2018 | Kimmel | B29D 11/00769 |
| 2020/0333590 | A1* | 10/2020 | Kimmel | B29D 11/00769 |
| 2020/0400951 | A1* | 12/2020 | Zhang | G02B 6/0035 |
| 2022/0082935 | A1* | 3/2022 | Knorr | G02B 5/1852 |

OTHER PUBLICATIONS

Schleunitz et al., "Fabrication of 3D patterns with vertical and sloped sidewalls by grayscale electron-beam lithography and thermal annealing", Microelectronic Engineering 88, 2011, 5 pages.

* cited by examiner

METHOD OF MANUFACTURING A MICROELECTRONIC DEVICE HAVING AN ARRAY OF INCLINED RELIEFS

TECHNICAL FIELD

The invention relates to the field of producing gratings of patterns or structures that each have at least one slanted flank. These gratings are generally called blazed gratings.

The invention has for example for advantageous application the diffraction gratings applied in particular to the fields of displays or optronics.

PRIOR ART

For many applications, for example in the field of displays or optronics, it is advantageous to carry out structures of which at least one flank is slanted, i.e. that is not parallel, and is not perpendicular, to a plane wherein the substrate carrying the patterns mainly extends.

The known solutions for producing gratings of patterns having at least one slanted flank entail steps of EBL (electron beam lithography) with dose modulation.

EBL is known for allowing for the production of structures of the staircase type with several steps by modulating the dose deposited locally in the positive resin.

In order to obtain structures that have a slanted flank and without a staircase, the two approaches hereinbelow are possible.

A first approach consists in increasing the number of steps for a given staircase height. Each one of the steps then has a height that is lower and the general profile of the structure approximates a slanted flank. This first approach has for disadvantage to not suppress the presence of steps. It above all has for disadvantage a production time and therefore a cost that are particularly high.

A second approach consists of having the fluid creep, i.e. imposing an annealing of the resin above its glass transition temperature, in order to smooth the staircase profile. This approach was proposed in the article "Fabrication of 3D patterns with vertical and sloped sidewalls by grayscale electron-beam lithography and thermal annealing" published by Arne Schleunitz, Helmut Schift in the magazine Microelectronic Engineering, 88 (2011) 2736-2739.

FIGS. 1A to 1D are drawn from this article. FIGS. 1A and 1B are photos taken with scanning electron microscopy (SEM) of a multilevel structure in the form of a staircase having respectively four steps 22-25 and three steps 22-24.

The structure in the form of a staircase comprises a portion 10 that forms the peak of the staircase and a portion 20 that forms the steps 22-25. The portion 10 has a peak 12 and a flank 11 perpendicular to the substrate. The portion 10 did not receive a dose. The portion 20 is formed in a portion of the positive resin that received a dose too weak to be completed developed.

FIGS. 1C and 1D show the results obtained after creeping of the structures of FIGS. 1A and 1B respectively. Each one of these structures comprises a flank 21 that has a substantially continuous slanted profile, obtained by creeping of the portion 20.

In practice, it transpires that this type of solution is not compatible with production rates and large surfaces of exposure. This therefore limits its use on an industrial scale with reasonable costs.

Furthermore, it often occurs that the parameters of the creeping do not make it possible to obtain a flank 21 that is actually continuous, i.e. not having a discontinuity corresponding to residues of steps.

Moreover, a hook 13 or a step is observed between the peak 12 of the portion 10.

There is therefore a need that consists of proposing a solution to attenuate, even suppress, at least one of the disadvantages of the solutions of the prior art.

Such is an objective of the present invention.

In particular, an objective of the present invention consists of proposing a solution for obtaining a grating of structures each having at least one slanted flank with improved productivity with respect to the known solutions.

The other objects, characteristics and advantages of the present invention shall appear when examining the following description and the accompanying drawings. It is understood that other advantages can be incorporated.

SUMMARY

To reach this objective, according to a first aspect the present invention provides a method for producing a microelectronic device having a subsequent grating of reliefs of which at least one wall is slanted. The method comprises at least the following steps:
 providing a structure comprising:
  a base,
   an initial grating of reliefs, each relief having at least one proximal end in contact with the base, a distal end and at least one wall extending between the proximal end and the distal end,
  laying the reliefs of the initial grating on one another, by application of at least one stress on the structure, in such a way that walls facing two adjacent reliefs come into contact. For example, it is considered that the initial grating comprises at least two adjacent reliefs in such a way that walls facing said at least two adjacent reliefs come into contact. At least one subsequent grating of reliefs each having at least one slanted wall is thus obtained.

Thus, this method proposes to cause a controlled collapsing of the reliefs carried out on a deformable structure. The reliefs of the initial grating slant with respect to the base to lay on one another. This inclination is remanent and subsists after application and/or removal of the stress. The reliefs then each have at least one portion of wall accessible from the outside of the device and which is slanted with respect to a plane wherein the base mainly extends. Thus, the invention advantageously benefits from the phenomenon of collapsing of patterns to form a device that has a grating of slanted patterns. In the field of microelectronics, it is sought to avoid this phenomenon of collapsing of patterns which is usually perceived as a detrimental constraint, since it is responsible for defects on the structures that are desired to be obtained.

A structure is thus obtained that comprises patterns the flanks of which are slanted with respect to a normal to the plane wherein the structure mainly extends. Moreover, the angle defining this inclination is controlled with precision. Furthermore, this method makes it possible to easily form a grating the reliefs of which are dissymmetrical, i.e., the adjacent walls of a same relief, for example the walls defining the peak of a relief, have different inclinations with respect to the normal to the plane wherein the structure mainly extends.

According to a non-limiting example, the device forms a mold for nanometric printing. The mold is intended to transfer, by nanometric printing, the inverse of the slanted reliefs in a deformable layer.

According to another embodiment, the device does not form a mold for nanoprinting. It can for example form an optical device or a stack intended to then be transferred in an underlying substrate by etching.

Preferably, the reliefs of the structure were formed, before laying, by one of the following techniques of lithography: optical lithography, electronic lithography, nanometric printing.

Another aspect of the present invention relates to a method for producing at least one grating of slanted patterns on a layer, the method comprising at least the following steps:

providing a mold for nanometric printing by implementing the method described hereinabove;

having the subsequent grating of slanted reliefs penetrate into the layer in order to form on a first face of the layer a grating of patterns according to the slanted reliefs, detaching the mold from the layer.

Thus, it is possible to produce via nanoprinting a layer of resin, a grating of patterns each having a slanted face. The grating of patterns is obtained in a particularly simple and reproducible manner from a mold that has slanted reliefs by collapsing of an initial grating of reliefs.

The slanted patterns of the grating can have a slanted wall that is perfectly smooth. Indeed, this wall is formed by inclination of an initially vertical wall that can easily be obtained with the conventional methods of lithography (optical lithography, electronic lithography, nanometric printing).

In this way, the present invention makes it possible to avoid the disadvantages of the known solutions mentioned in the section concerning the prior art and which provides for the formation of a staircase profile to obtain a slanted wall.

Furthermore, the proposed solution makes it possible to obtain a slanted wall, smooth, adjacent to an end wall that is perpendicular to it.

The peak of each pattern is defined by walls that have dissymmetrical inclinations with respect to the normal to the plane wherein the second face of the layer mainly extends.

Furthermore, contrary to the solution of the prior art mentioned hereinabove, the proposed solution has for advantage to not require the use of resins that are compatible with a grey-scale lithography.

Moreover, contrary to the prior art mentioned hereinabove, the proposed solution easily makes it possible to avoid the appearance of a hook or of a step between a first structure portion forming a flank having a first inclination and a second structure portion forming a flank having a second inclination. This hook 13 can be seen in FIGS. 1C and 1D.

The proposed solution makes it possible to considerably reduce the number of steps and therefore the duration of execution by comparison to the solution of the prior art presented hereinabove and which requires a multilevel starting structure.

The proposed solution therefore makes it possible to considerably increase production rates.

Moreover, the proposed solution is perfectly compatible with large surfaces. Indeed, this solution allows in a single printing step to form very many patterns on the surface of a substrate and does not require the use of a localised lithography such as an electron beam lithography such as the prior art mentioned hereinabove provides.

Optionally, the method for producing a microelectronic device that has a grating of slanted reliefs can furthermore have at least any one whatsoever of the following characteristics that can be taken individually or in a combination:

parameters of the initial grating, comprising in particular a form of the reliefs, a step P of the initial grating and a material of the initial grating, are chosen in such a way that after laying of the reliefs, each relief has at least one slanted wall by an angle $\alpha$ different from 90° with respect to a plane z1x1 wherein a face of the base extends mainly.

after laying, there is no vacuum or closed cavities between two adjacent reliefs.

the reliefs of the initial grating form, before the step of laying, at least one among:

lines extending mainly in a direction z1 parallel to a plane z1x1 wherein is mainly comprised a face of the base of the structure from which the reliefs extend and studs of polygonal or circular section, the section being taken according to the plane z1x1.

before the step of laying of the reliefs, the at least one wall extends mainly in a direction y1 perpendicular or a direction z1 parallel to a plane z1x1 wherein is mainly comprised a face of the base of the structure from which the reliefs extend.

according to an embodiment, laying the reliefs comprises the application of at least one stress on at least one among the base of the structure and the reliefs, preferably at least the end of the reliefs, and the application of a complementary stress or of a reaction force (R) on the other among the base of the structure and the reliefs, preferably at least the end of the reliefs, and in such a way as to cause a relative displacement between the base of the structure and the reliefs. Thus, according to this example, the deformation or the collapsing of the reliefs is obtained by application of stresses. This embodiment is particularly simple to implement.

according to an example the at least one stress applied on the structure, in such a way that walls facing two adjacent reliefs come into contact, comprises or is a force. This force is taken from: a contact force and a non-contact force.

according to an embodiment, laying the reliefs comprises the application of at least one contact force (F1, F2) on at least one among the base of the structure and the reliefs, preferably at least the end of the reliefs, and the application of a complementary force or of a reaction force (R) on the other among the base of the structure and the reliefs, preferably at least the end of the reliefs, and in such a way as to cause a relative displacement between the base of the structure and the reliefs. Thus, according to this example, the deformation or the collapsing of the reliefs is obtained by application of contact forces. This embodiment is particularly simple to implement.

the at least one contact force (F1, F2) of the structure has:

a component (F1) substantially parallel to a plane z1x1 wherein is mainly comprised a face of the base of the mold from which the reliefs extend;

a component (F2) substantially perpendicular to the plane. z1x1.

Generally, the component F2 is applied parallel to the main direction according to which the reliefs extend in the plane x1y1.

According to an example, the at least one contact force (F1, F2) is applied on the base of the structure when the distal ends of the reliefs of the structure are in contact with an intermediate substrate.

Thus, according to this embodiment, in order to collapse the reliefs of the structure, it is possible to apply a strength that tends to displace the base of the structure without displacing the distal ends of the reliefs which remain anchored in the intermediate substrate. The contact force is thus applied on the base of the mold. The intermediate substrate applies a reaction force on the reliefs, more precisely on their distal ends.

According to another embodiment, laying the reliefs comprises the application of a stream of fluid on the reliefs of the initial grating. The stream can be a stream of liquid or gas. It can have the form of a beam or a web. In this case, the stress exerted by the reliefs is a non-contact force.

According to a first non-limiting example, providing the structure comprises a step of nanoprinting for producing the initial grating of reliefs. Alternatively, providing the structure comprises a step of optical or electronic lithography, for producing the initial grating.

BRIEF DESCRIPTION OF THE FIGURES

The purposes and object as well as the characteristics and advantages of the invention shall appear better in the detailed description of embodiments of the latter which are illustrated in the following accompanying drawings wherein:

FIGS. 1A to 1D are photos via scanning electron microscopy (SEM), of which FIGS. 1A and 1B are of multi-level structures according to the prior art, i.e., structures that have a staircase shape, and of which FIGS. 1C and 1D show the results obtained after creeping of the structures of FIGS. 1A and 1B, respectively.

FIG. 8A shows a mold obtained after inclination of the reliefs of the mold shown in FIG. 7.

FIG. 8B shows an enlargement of the zone B shown in FIG. 8A.

Figure 1A:
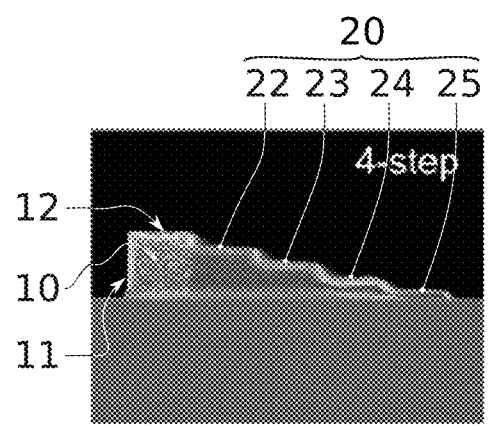
Figure 1B:
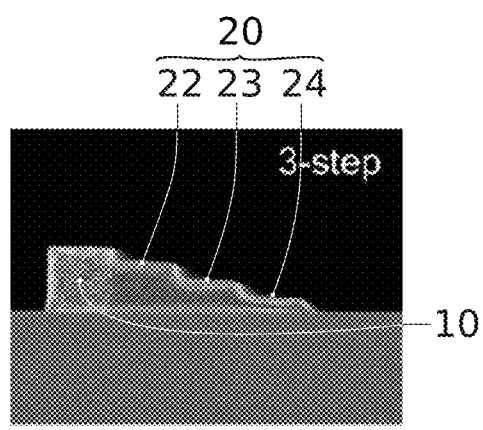
Figure 1C:
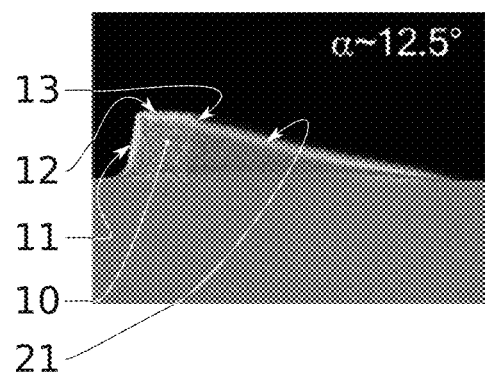
Figure 1D:
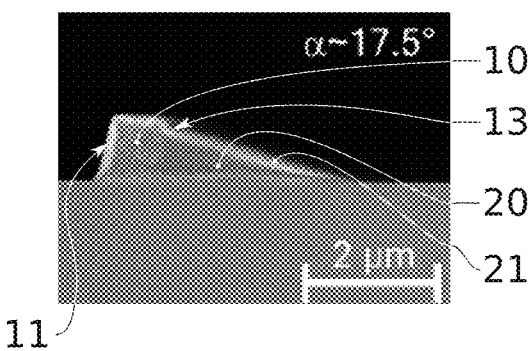

The drawings are given as examples and do not limit the invention. They constitute block diagrammatical representations intended to facilitate the understanding of the invention and are not necessarily on the scale of practical applications. In particular the relative thicknesses of the different layers and of the different patterns are not necessarily representative of reality.

DETAILED DESCRIPTION

Before starting a detailed review of embodiments of the invention, hereinafter optional characteristics are disclosed that can possibly be used in combination or alternatively:

According to an example, the patterns of the mold each have at least one slanted flank with an angle $\alpha$ different from 90° with respect to a plane $z_2x_2$ wherein a second face of the layer mainly extends opposite the first face.

According to an example, laying the reliefs of the initial structure of the mold comprises the application of at least one contact force (F1, F2) on at least one among the base of the structure and the reliefs, preferably at least the end of the reliefs, and the application of a complementary force or of a reaction force on the other among the base of the structure and the reliefs, preferably at least the end of the reliefs, and in such a way as to cause a relative displacement between the base of the structure and the reliefs.

According to an example, the at least one contact force (F1, F2) of the structure has:
a component (F1) substantially parallel to a plane $z_1x_1$ wherein is mainly comprised a face of the base from which the reliefs extend;
a component (F2) substantially perpendicular to the plane $z_1x_1$.

According to an example, the at least one contact force (F1, F2) is applied on the base of the structure when the distal ends of the reliefs of the structure are in contact with an intermediate substrate the substrate having a face intended to come into contact with distal ends of the reliefs, said face preferably comprising a film having a friction coefficient less than or equal to 0.01.

This embodiment makes it possible to control with precision the collapsing of the patterns.

According to an example, the at least one contact force is applied on the base of the mold before putting the mold and the layer into contact and when the distal ends of the reliefs of the mold are in contact with an intermediate substrate.

According to an example, the at least one contact force (F1, F2) is applied on the base of the mold after penetration of a portion at least of the initial grating of reliefs into the layer, preferably before a complete penetration of the reliefs of the mold into the layer.

This embodiment makes it possible to limit the number of steps. It thus provides an effective solution in light of the problem consisting of reducing the duration and the cost of the method.

According to an example, the reliefs have, before laying, a height H taken between the distal end of the reliefs and a face of the base of the mold from which the reliefs extend. The at least one contact force (F1, F2) is applied on the base of the mold when the height hp of the reliefs having penetrated into the layer is comprised between 0.1 and 0.7 times the height H of the reliefs. A good anchorage of the distal ends of the reliefs inside the layer is thus ensured. This favours the control of the inclination of the reliefs and therefore the final geometry obtained.

According to an example, laying the reliefs of the initial grating of the mold comprises applying a stream of fluid on the reliefs of the mold. Thus, in this example the stress applied to the reliefs is a stream of fluid.

This embodiment makes it possible to reduce the defects that can appear in the embodiments that provide for laying the reliefs by application of a contact force. Indeed, in these embodiments, a contact defect, such as the presence of dust at the interface between the reliefs and the point of application of the force can cause a defect in the positioning of the reliefs.

According to an example, the reliefs of the mold have a basic material and a coating that covers the basic material, the coating having a friction coefficient less than that of the basic material.

Thus, the mold, at the very least the reliefs of the mold, are covered with an anti-adhesive treatment. This makes it possible to facilitate the detaching of the mold after printing in the deformable layer. Residues of the deformable layer subsisting between the reliefs of the mold is thus prevented. The quality of the grating of patterns formed is thus improved.

According to an example, after having detached the mold from the layer, a step of transferring is comprised, by etching, of the grating of patterns in a substrate underlying said layer.

According to an example, the mold is a flexible mold. It is deformed, for example by lamination, to replicate these reliefs in the layer of resin.

According to an example, providing the mold comprises the following steps:
producing a master that has reliefs corresponding to the reliefs of the mold,
transferring the reliefs of the master in the mold by one of the following techniques: lithography, nanometric printing.

According to an example, said layer is a resin, more preferably that can be thermoset or polymerised.

In the framework of this present invention, a microelectronic device is qualified as any type of device produced with microelectronic means. These devices encompass in particular in addition to devices with a purely electronic purpose, micromechanical or electromechanical devices (MEMS, NEMS . . . ) as well as optical or optoelectronic devices (MOEMS . . . ). It can entail a device intended to provide an electronic, optical, mechanical etc. function. It can also entail an intermediate product intended solely for the production of another microelectronic device. Thus, a microelectronic device can be a mold for nanoprinting or a stack that comprises patterns intended to be transferred by etching in another layer. It can also entail a functional microelectronic device.

In the framework of this present invention, a resin is qualified as an organic or organic-mineral material that can be formed via exposure to a beam of electrons, photons, X-rays, a beam of light in the ultraviolet, extreme ultraviolet (UEV) or deep ultraviolet (Deep UV) ranges typically in the range of wavelengths from 193 nm to 248 nm, the emission lines of a mercury lamp, i.e.: 365 nm for the I line, 435 nm for the G line and 404 nm for the H line. The invention also applies to resins that can be formed mechanically, in particular by thermally-assisted printing or by ultraviolet.

A resin is qualified as deformable when it can be formed mechanically, in particular by thermally-assisted printing or by ultraviolet.

Mention can be made by way of example of resins that are conventionally used in microelectronics, resins with a methacrylate base (for example Polymethyl methacrylate PMMA), polyhydroxy styrene (PHS). Mention can also be made of the resin families novolak, epoxy and acrylate.

In the present patent application, the thickness of a layer is measured in a direction perpendicular to a plane wherein a face of the substrate mainly extends on which the layer rests. In the figures, this thickness is measured according to the direction z of the orthogonal spatial system xyz.

In the present patent application, an inclination a formed by a wall or a flank of a pattern corresponds to the angle formed between the surface on which this layer rests and the tangent to this wall or this flank at the point considered.

It is specified that, in the framework of the present invention, the terms "on", "overmounts", "covers", "underlying", "facing" and the equivalents thereof do not necessarily mean "in contact with". Thus for example, the deposition, transfer, gluing, assembling or the application of a first layer on a second layer, does not necessarily mean that the two layers are directly in contact with one another, but means that the first layer covers at least partially the second layer by being either directly in contact with it, or by being separated from it by at least one other layer or at least one other element.

Likewise, when it is indicated that a pattern or structure overmounts a substrate, this can mean that pattern or structure are directly in contact with the substrate or that one or more layers are interposed between the pattern or the structure and the substrate.

The term "step" does not necessarily mean that the actions carried out during a step are simultaneous or immediately successive. Certain actions of a first step can in particular be followed by actions linked to a different step, and other actions of the first step can then be resumed. Thus, the term step does not necessarily mean actions that are unitary and inseparable over time and in the sequencing of the phases of the method.

The invention shall now be described in reference to FIGS. 2A to 18B.

As shall be described in more detail in what follows, the proposed method uses the capacity of reliefs formed in a deformable material to slant and collapse in order to come into contact with one another and thus form a blazed grating, i.e. a grating of slanted reliefs.

According to an embodiment shown in FIGS. 2A to 17, the microelectronic device of which the collapsing of the reliefs shall be controlled is intended to form a mold for nanoprinting. Another embodiment, shown in FIGS. 18A and 18B, relates to the production of a microelectronic device comprising a substrate overmounted with a layer of resin carrying the reliefs of which the collapsing is controlled.

Figure 2A:
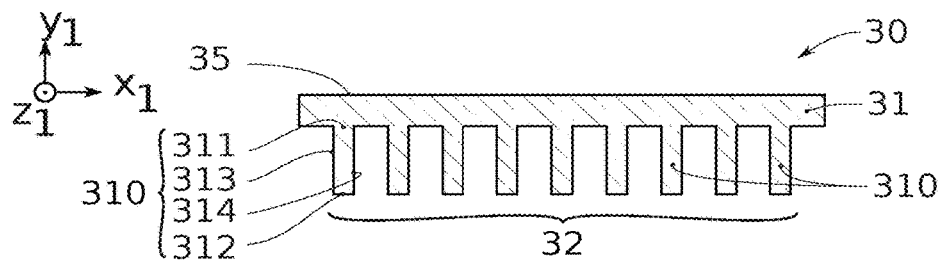
FIG. 2A shows a first step of producing a microelectronic device intended to form a mold for nanometric printing. This figure shows the mold before collapsing of the reliefs.
Figure 2B:
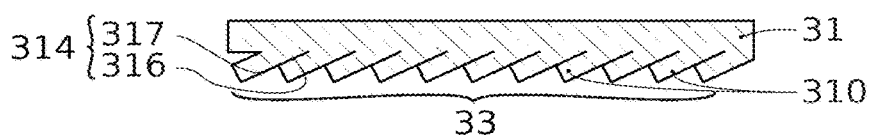
FIG. 2B shows the result of a second step of producing the mold shown in FIG. 2A. This figure shows the mold after collapsing of the reliefs.

FIGS. 2A and 2B diagrammatically show the production of a mold 30 for nanoprinting that has a grating 33 of slanted reliefs 310. A first step consists of providing a mold 30 having non-slanted reliefs 310. These reliefs 310 have at least one wall 313, 314 extending from a proximal end 311 in contact with a base 31 of the mold 30 and to the distal end 312 thereof. The reliefs 310 form a grating 32.

Each relief 310 extends at least in a direction $y_1$ perpendicular to a plane $z_1x_1$ wherein a face 35 of the mold 30 mainly extends.

Each relief 310 can form a stud. In this case, the section of each relief 310, in a plane parallel to the plane $z_1x_1$, has a polygonal, ovoid or circular shape. Preferably, each stud has a constant section along the axis $z_1$.

According to another example, each relief 310 forms a straight line. In this case, this line can extend mainly in a direction $z_1$ parallel to the plane $z_1x_1$. In the framework of this present invention, a line or in-line relief is qualified as a relief forming a rib or a trench extending mainly in a direction parallel to a face of the layer supporting this relief. According to yet another example, each relief forms a curved line.

As shown in FIG. 2B, a controlled collapsing of the reliefs 310 is carried out in such a way that the latter come into contact with one another. A first portion 316 of wall 314 of a given relief 310 is then covered by the wall 313 of a relief that is adjacent to it. In the extension of this first portion 316, the wall 314 has a second portion 317 which is not covered by the adjacent relief. This second portion that is accessible from the outside forms a slanted profile.

This collapsing results in the reliefs 310 being stressed. Several examples for carrying out this collapsing of the patterns shall be described in detail in the rest of the description and in reference in particular to FIGS. 11A to 12E. The slanted position of the reliefs 310 obtained after collapsing is remanent, i.e., it subsists after suppression of the stress applied on the mold 30. Thus, the reliefs do not return to their initial position after suppression of the stress.

A mold 30 is thus obtained that has on one of its faces a grating 33 of slanted patterns 310.

Figure 3A:
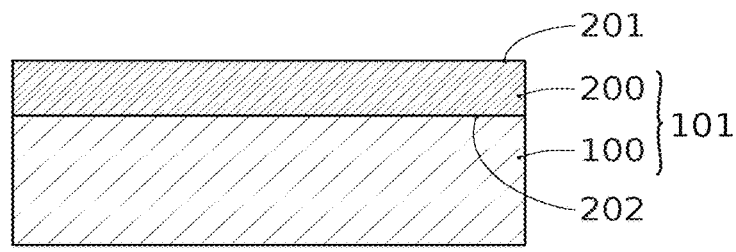
FIG. 3A shows a stack comprising a layer of resin.
Figure 3B:
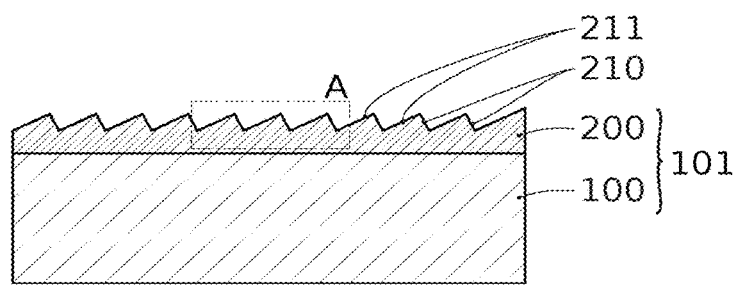
FIG. 3B shows the result of a step of printing in the resin of the mold obtained in FIG. 2B.
Figure 3C:
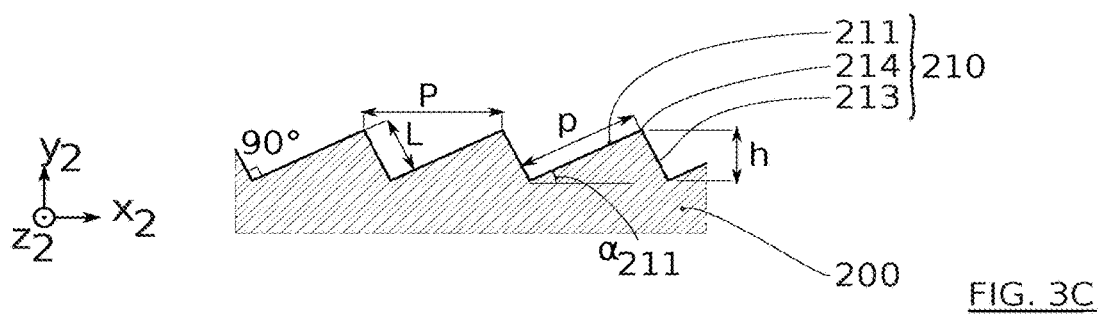
FIG. 3C shows an enlarged view of the zone A shown in FIG. 2D.

FIGS. 3A to 3C show the use of the mold 30 with a stack 101 comprising a substrate 100 supporting a deformable layer 200. The deformable layer 200 has a face 201 turned outwards and a face 202 turned towards the substrate 100. The layer 200 is preferably a resin.

FIG. 3B shows the transfer by nanometric printing of the reliefs 310 of the mold 30 in the resin 200 of the stack 101. When the mold 30 is removed from the resin 200, it leaves as an imprint in the latter a grating of patterns 210 corresponding to the inverse of the grating 33 carried by the mold 30.

The patterns 210 formed in the resin each have at least one flank 211 slanted by an angle $\alpha 211$ different from 90° with respect to a plane $z_2x_2$ wherein the second face 202 of the layer 200 mainly extends.

The grating of patterns 210 formed in the layer 200 of resin is characterised by several parameters shown in FIG. 3C of which in particular:
  the angle $\alpha 211$ of inclination of the flank 211 of the patterns 210,
  a step P of the grating of the patterns 210,
  a height h of the patterns, corresponding to the greatest distance between peaks and troughs of the patterns 210,
  a length p of the patterns, measured in a direction parallel to the edge formed by the flank 211 of the patterns 210 in a cross-section $x_2y_2$.
  a length L of a wall 213 forming with the flank 211 a peak 214 for the pattern.

Figure 7:
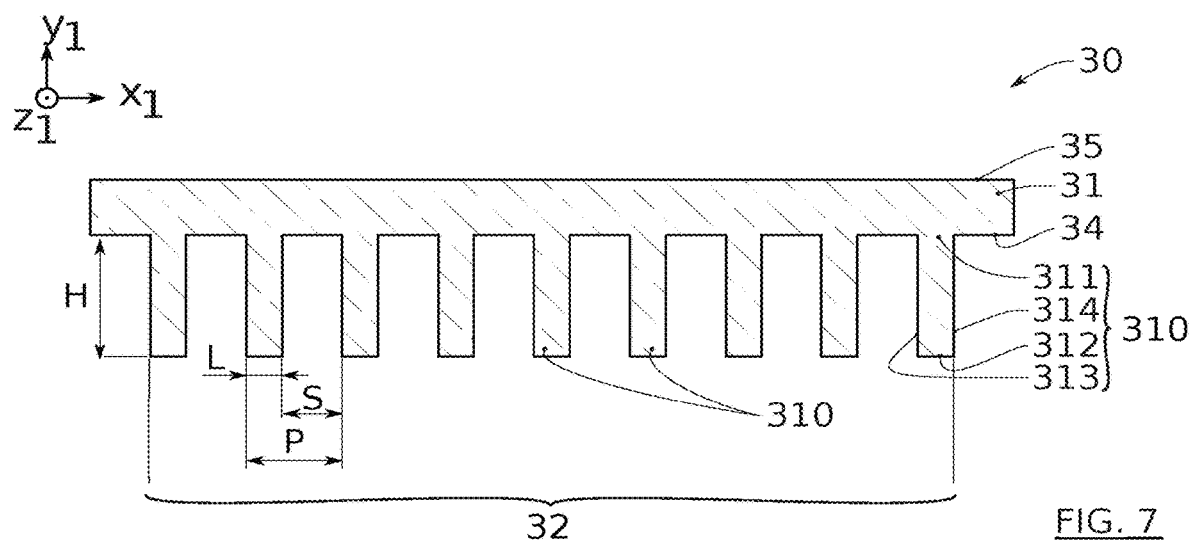
FIG. 7 shows an example of a mold before inclination of the reliefs.
Figure 8A:
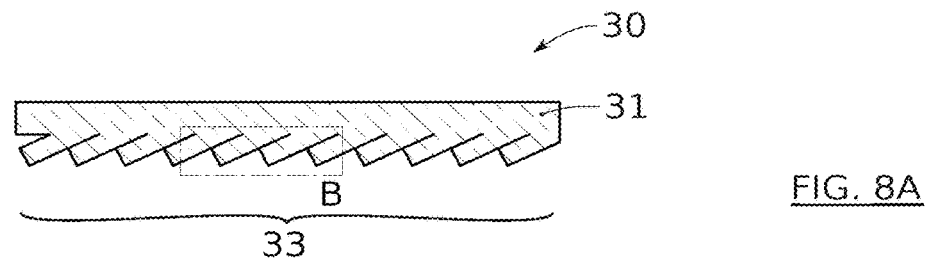
FIGS. 8A to 8B diagrammatically show steps of an embodiment of a mold.
Figure 8B:
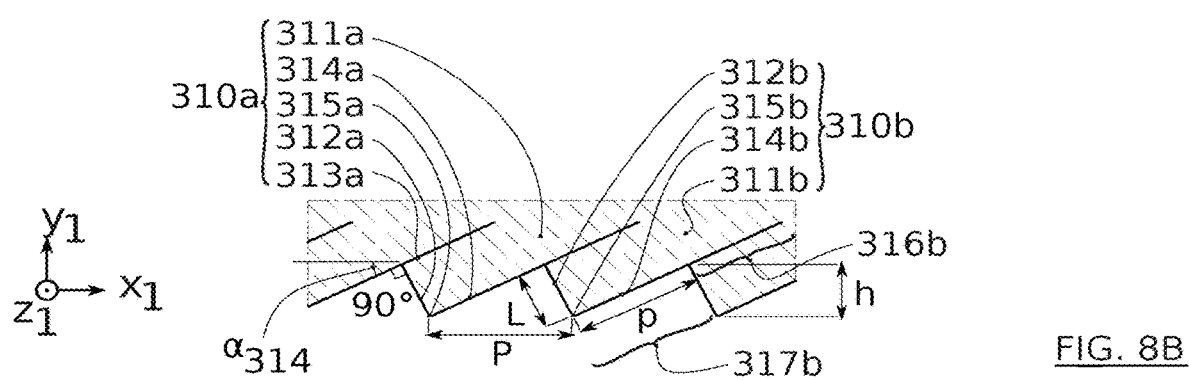
Figure 9:
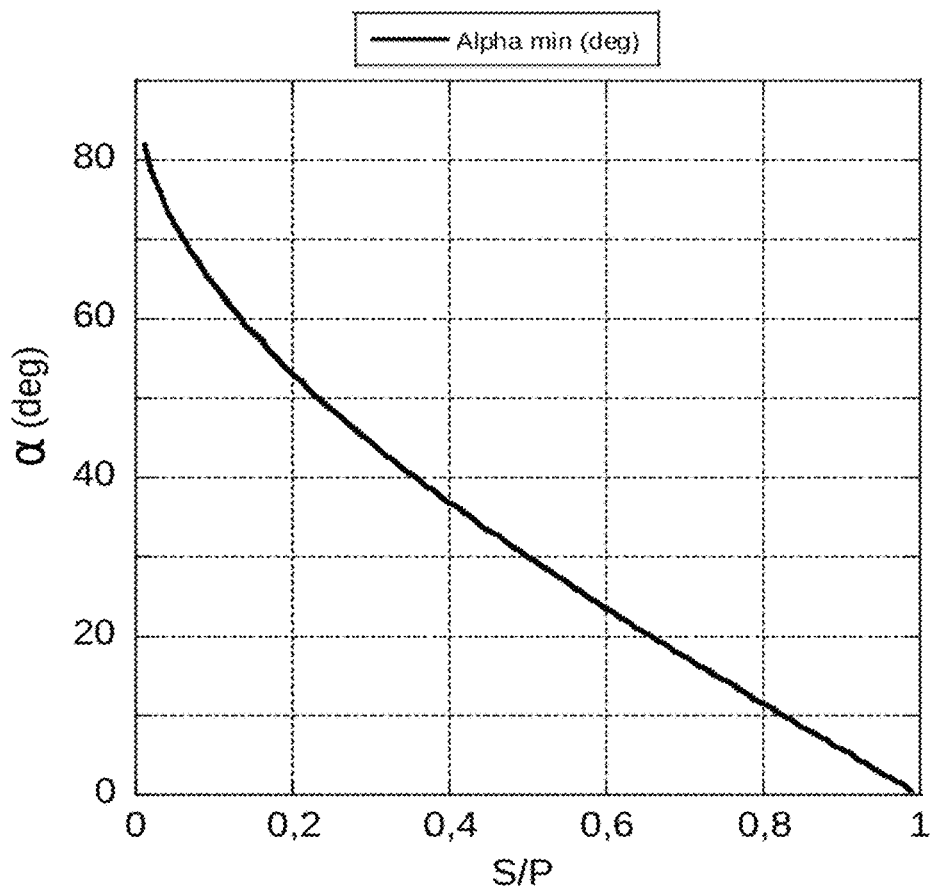
FIG. 9 is a graph showing the range of angles that can be accessed for the blazed gratings according to the geometry of the initial grating.

Obtaining the desired values by these parameters will in particular be a function of the geometry of the mold 30, such as shall be described in more detail in reference to FIGS. 7 to 8B.

Note that it is possible to obtain patterns 210 of which the peak 214, defined by the flank 211 and the wall 213, forms a right angle. This right angle reproduces the right angle formed by each wall 313, 314 with the distal end 312 of the reliefs 310 of the mold 30. As it appears in FIG. 3C, the flank 211 and the adjacent wall 213 of a same pattern then have dissymmetrical inclinations with respect to a normal to the plane wherein the layer 200 mainly extends.

Naturally, if the distal ends 312 of the reliefs do not form a right angle with the walls 313, 314 of the reliefs 310 of the mold 30, then the patterns 210 will not form a right angle.

Moreover, note that the flank 211 can be perfectly smooth. It corresponds to the imprint left in the layer 200 by the portion 317 of the relief 310 of the mold 30. Thus, this flank 211 does not have any roughness as would be the case with a solution based on the formation of a staircase profile.

Several embodiments of a mold 30 shall now be described in detail.

According to a first step, a structure called master 40 is carried out. Preferably, this structure is made from materials that are compatible with the white room techniques for structuring methods of micro and nanotechnologies.

According to an example, the master 40 has a silicon base. Preferably it is formed from silicon. This master has a structuring, also designated as reliefs, which can be organised in the form of grating(s) 42.

The grating 42 of this master 40 is then transferred in a deformable material, preferably a polymer, by one of the nanoprinting techniques. Nanoprinting techniques, group together in particular the methods based on a hot stamping and the methods of replication assisted by ultraviolet (UV).

Figure 4A:
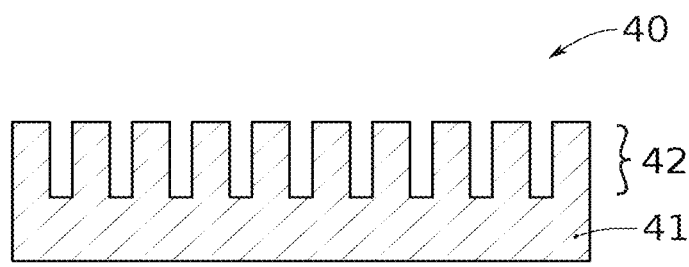
FIGS. 4A to 4D diagrammatically show steps of a first embodiment of a structure that has a grating of reliefs, before inclination of the reliefs.
Figure 4B:
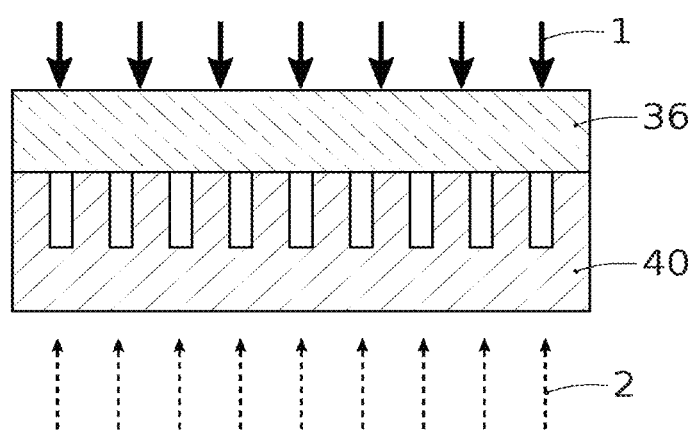

FIGS. 4A to 4D show steps of a method of nanoprinting by hot stamping. FIG. 4A shows the master 40. A layer 36 is then applied on the grating 42 of reliefs of the master 40. A pressure 1 is exerted on at least one among the layer 36 and the master 40 in such a way that the layer 36 penetrates inside troughs formed by the grating 42 of reliefs. Preferably, heat 2 is applied, for example from a rear face of the base 41 of the mold 40, in order to facilitate the forming of the layer 36.

Figure 4C:
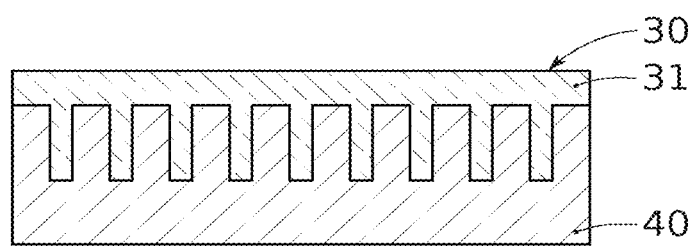

As shown in FIG. 4C, a portion of the layer 36 penetrates into the troughs of the grating 42. The layer 36 then has the shape that is desired to be given to the mold 30.

Figure 4D:
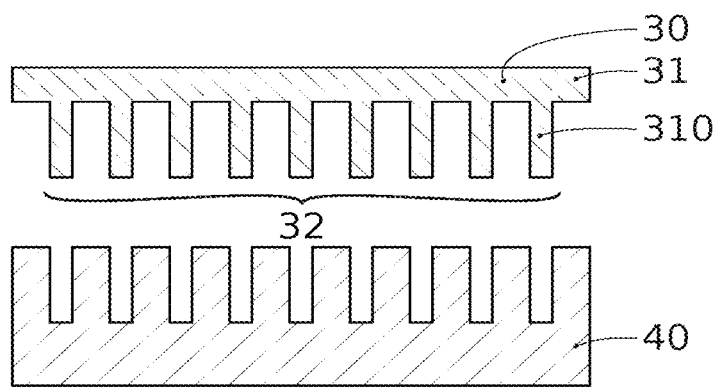

As shown in FIG. 4D, the mold 30 is then removed. For this, it is ensured that the latter is sufficiently hardened. The suppression of the heating applied during the step of stamping facilitates the hardening of the mold 30.

The mold 30 then has a base 31 from which the reliefs extend 310, the latter forming a grating 32 inverse of that of the master 40.

In this embodiment, the mold is for example formed mainly, or solely from a thermoplastic material.

FIGS. 5A to 5D show steps of a method of nanoprinting by UV printing, also designated as UV replication.

Figure 5A:
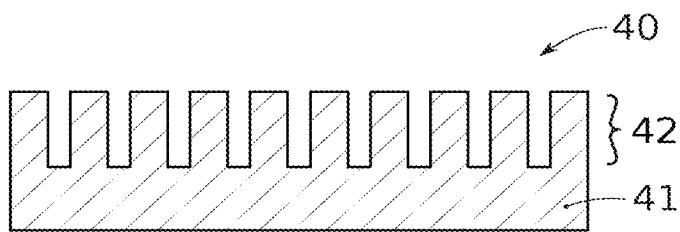
FIGS. 5A to 5D diagrammatically show steps of a second embodiment of a structure that has a grating of reliefs, before inclination of the reliefs.

On the master 40 of FIG. 5A, a stack is applied, carried out beforehand, comprising at least:
  one printable layer 36, preferably at ambient temperature, one face of which is turned facing the reliefs of the master 40,
  one support substrate, also called a handle substrate 37. It can be a polymer film.

Figure 5B:
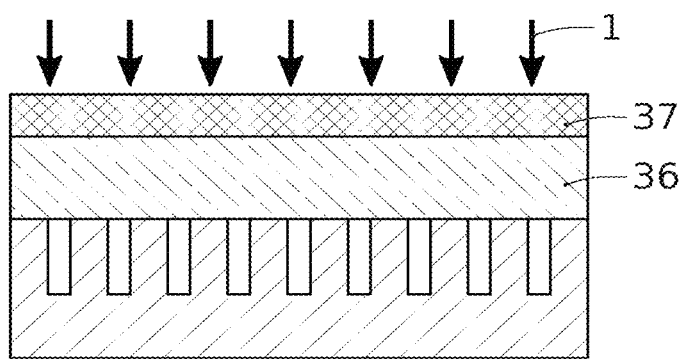
Figure 5C:
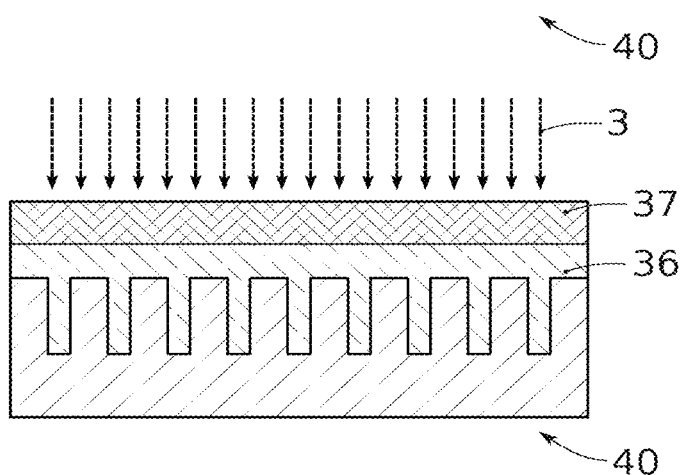

As shown in FIG. 5B, a pressure is applied on a rear face of the handle substrate 37 in such a way as to press the printable layer 36 against the reliefs of the master 40.

Figure 5D:
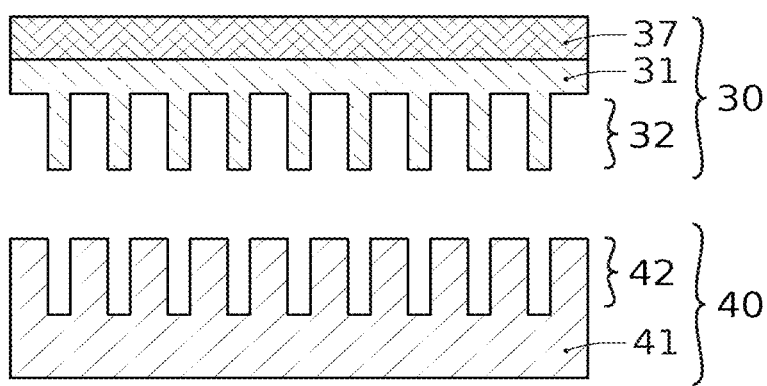

When the printable material of the layer 36 has penetrated into the troughs formed by the reliefs of the master 40, a luminous flux is applied, typically an ultraviolet flux on this layer 36, through the handle substrate 37. This insolation allows for a hardening of the material of the layer 36. As shown in FIG. 5D, the mold 30 thus formed can then be removed, which has a grating 32 of reliefs, inverse of the grating 42 of the master 40.

FIGS. 6A to 6D show steps of another method of nanoprinting by UV printing.

Figure 6A:
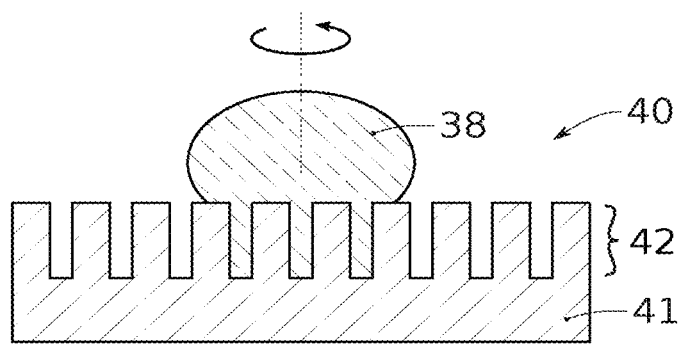
FIGS. 6A to 6D diagrammatically show steps of a third embodiment of a structure that has a grating of reliefs, before inclination of the reliefs.
Figure 6B:
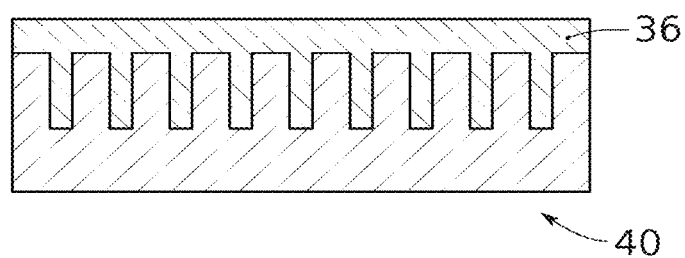

On the master 40 of FIG. 6A, a deformable material 38 is deposited. Via centrifugation (spin coating) this material 38 is spread over the surface of the master 40. Thus, the deformable material fills the troughs of the grating 42 of the master 40. A handle substrate 37 is then deposited on a remaining free face of the layer 36 spread.

Figure 6C:
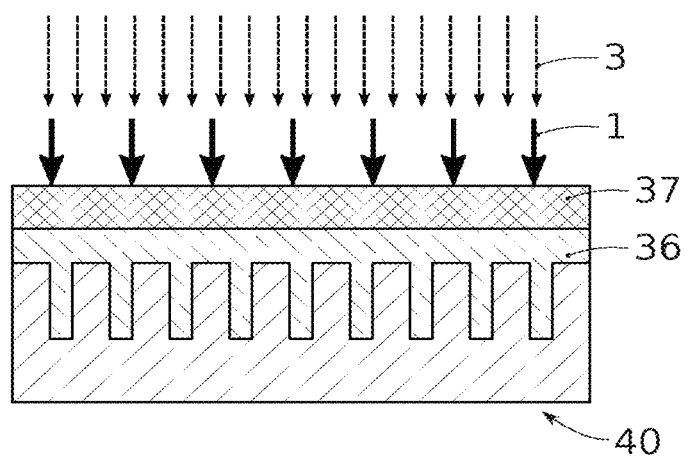
Figure 6D:
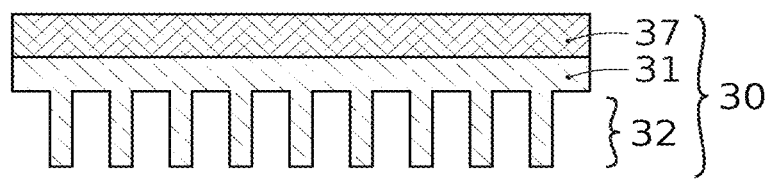
Figure 6D:
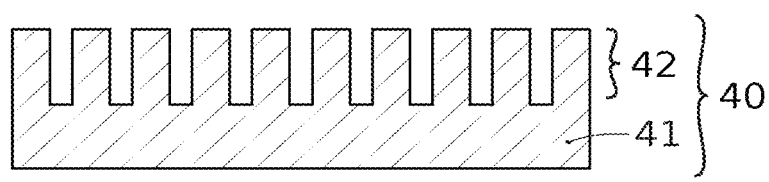

As shown in FIG. 6C, preferably, a pressure is applied on the rear face of the handle substrate 37. Also preferably, a step of insolation is carried out, for example via UV, to harden the material of the layer 36. As shown in FIG. 6D, it is then possible to remove the mold 30 thus formed, which has a grating 32 of reliefs, inverse of the grating 42 of the master 40.

FIGS. 7, 8A and 8B show in detail a mold 30 before collapsing of the reliefs and after collapsing of the reliefs.

FIG. 7 shows several geometrical parameters of the initial grating 32, i.e. before collapsing of the reliefs 310. The initial grating 32 of reliefs 310 is characterised by several parameters of which in particular the following dimensions:
  a height H of the reliefs 310, corresponding to the distance between the proximal end 311 and the distal end 312 of the reliefs 310. This height H is measured in this example in the direction $y_1$; this direction corresponds to the main direction of extension of the reliefs 310.
  a width L of the reliefs, taken in the direction $x_1$. When the reliefs 310 form lines extending in the direction $z_1$, this width corresponds to the distance between two walls 313, 314. When the patterns form circular studs, L corresponds to the diameter of the studs;
  a spacing S between two consecutive reliefs 310;
  a step P of the grating 42 of reliefs. P=L+S.

From the mold of FIG. 7, the collapsing of the reliefs 310 on one another is caused. The collapsing angle as well as the geometrical dimensions of the starting reliefs then make it possible to form the blazed or slanted grating 33.

The slanted grating 33 is characterised by several parameters of which in particular the following dimensions determined by the initial grating 32:
  the angle α314 of inclination of the walls 314 of the reliefs 310. This angle α314 is measured with respect to the plane $z_1x_1$. This angle α314 is equal to the angle α211 of the patterns 210 formed in the deformable layer 200, as shown in FIG. 3C. With a concern for concision, in the rest of the description these angles α314 and α211 shall be designated solely under the notation a.
  the length p of the walls 314 of the reliefs 310. This length p corresponds to the second portion 317 of the wall 314 not covered by the adjacent relief. This length p also corresponds to the length p of the flank 211 of the patterns 210 formed, after printing of the mold 30, in the layer 200 of resin as shown in FIG. 3C.
  the step P of the grating 33 of reliefs. The step P can, after collapsing, be measured between the peaks 315 of two adjacent reliefs 310. This step P of the grating 33 of reliefs 310 corresponds to the step P of the grating of patterns formed after nanoprinting in the layer 200 of resin, as is shown in FIG. 3C.
  the width L of the reliefs 310, forming after collapsing, the length of a wall 312 defining with the portion 317 a peak 315 for the relief 310.
  the height h of the reliefs 310, corresponding to the distance between peaks 315 and troughs of the reliefs 310. This height h of the reliefs 310 corresponds to the height h of the patterns 210, as shown in FIG. 3C.

It is possible to establish a relationship between the angles α of the blazed grating and the geometrical characteristics of the initial grating 32 of the mold 30. Indeed:

$$\cos(90-\alpha) = 1 - \frac{S}{P}$$

Thus it is possible to determine the angles that are accessible with this approach. These angles can be determined from FIG. 9 which shows the range of angles that are accessible for the slanted gratings according to the ratio S/P.

The angle that it is desired to have on the slanted grating 33 of the mold (or on the grating of the layer 200 of resin) is determined and then the ratio S/P can be determined (space between two reliefs and period P of the initial grating 32).

The ratio L/P is then equal to:

$$\frac{L}{P} = 1 - \frac{S}{P}$$

Moreover according to the final use of the slanted grating 33, the height h will be chosen and then makes it possible to determine the value of L via the following relationship:

$$L = \frac{h}{\cos(\alpha)}$$

With the user determining h (or the period of the blazed grating) and a, this makes it possible to determine uniquely L and S (and therefore P). Moreover, for two adjacent reliefs to be in contact after the collapsing thereof it is preferable to respect the following condition on H:

$$H > p = \frac{L}{\tan(\alpha)}$$

Thus, according to the structuring methods implemented to manufacture the master 40, it must be ensured that the form ratio H/L (height H over width L) of the reliefs of the master 40 respects this condition:

$$\frac{H}{L} > \frac{1}{\tan(\alpha)}$$

Figure 10:
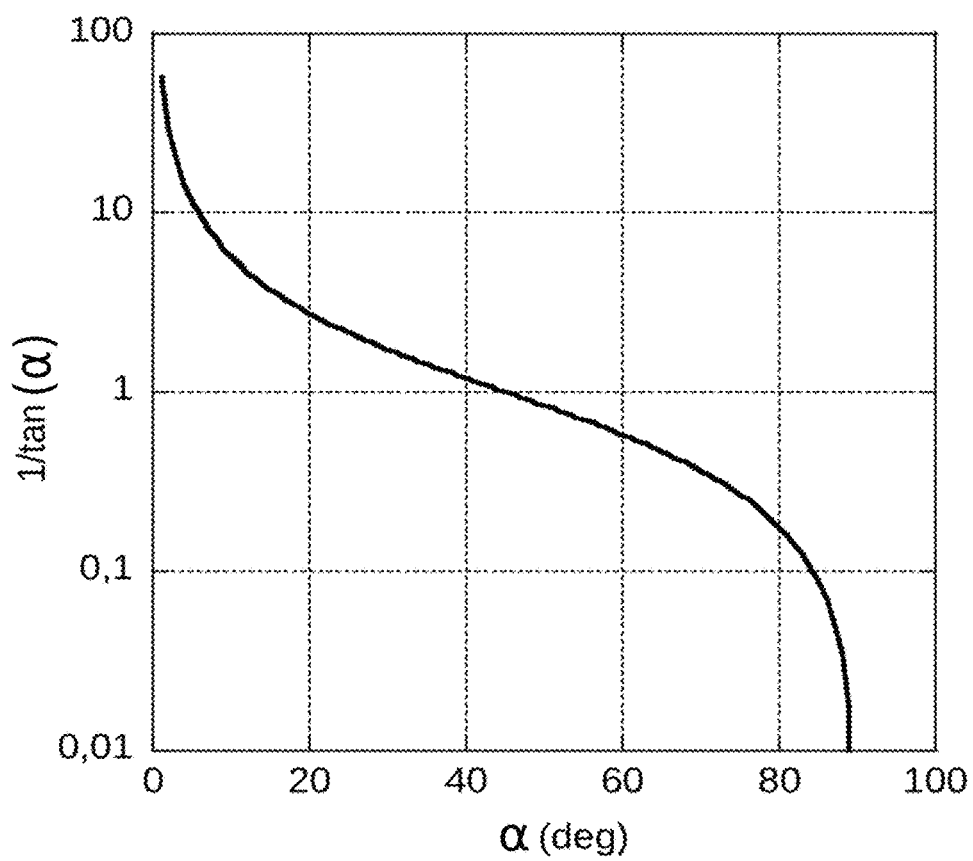
FIG. 10 is a graph showing the range of angles that can be accessed for the blazed gratings according to the geometry of the initial grating.

FIG. 10 corresponds to the function 1/tan(α).

It is to be noted that the higher the form ratio H/L is, the easier it is to carry out the collapsing of the reliefs 310. Consequently, the implementation of the method proposed will be easier when H/L is much greater than 1, which results in angles α for the blazed gratings 33 less than 45°. Advantageously, when the form ratio is greater than 3, the collapsing of the reliefs 310 is greatly facilitated by the behaviour of the resins that are usually used in lithography and by the mechanical properties thereof.

Naturally, it will be ensured that there are no contaminating particles that would voluntarily be deposited between the reliefs before collapsing.

Preferably, the resin is porous to air. The latter can thus escape through the material and allows the flanks of two adjacent reliefs to come into contact with one another.

During the collapsing, both rotation and deformation/displacement of the material of the layer, typically the layer of resin, may occur.

Preferably, the mold is a flexible mold. It can be applied on the layer 200 of resin by lamination, for example using a roller.

In order to obtain a controlled and remanent inclination of the reliefs of the mold the material forming the reliefs is chosen in such a way that once the reliefs are collapsed, the material composing its reliefs sticks to itself. Thus, once the reliefs are laid and thrust against one another, they remain in position.

Preferably, the resin is porous to air. This makes it possible in particular to prevent the formation of cavities filled with air inside. This porosity of the resin is measured by the permeability (measured in Barrer). In our case it is advantageous that this permeability to CO2 (often a measuring gas) be greater than 10 Barrer.

Several embodiments shall now be described to cause and control the collapsing of the patterns.

According to a first approach, the collapsing of the patterns is obtained by application of contact forces on the base 31 of the mold 30 and on the reliefs 310. This first approach shall be shown in reference to two embodiments shown respectively in FIGS. 11A to 11F and 12A to 12E.

The first embodiment consists of using an intermediate substrate 50, also designated as lamination substrate, so as to cause the collapsing of the reliefs 310.

Figure 11A:
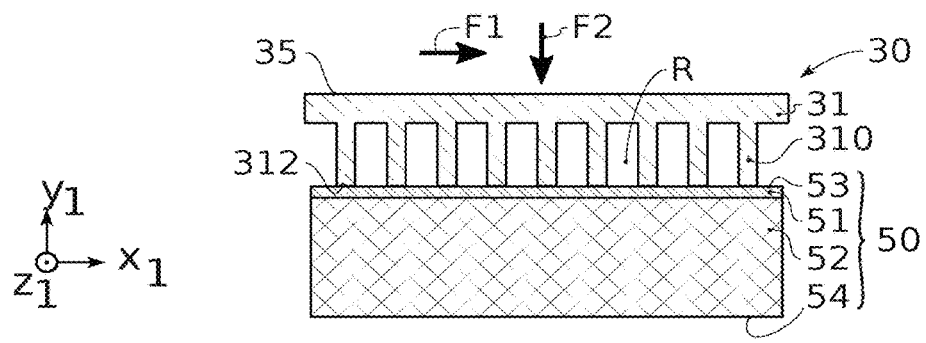
FIGS. 11A to 11F diagrammatically show steps of a first embodiment of a blazed grating.

As shown in FIG. 11A, the front face of the mold 30, that carrying the reliefs 310 is put into contact with the intermediate substrate 50. More precisely, the distal ends 312 of the reliefs 310 are in contact with a front face 53 of the intermediate substrate 50. On a rear face 35 of the mold 30 is then simultaneously applied:

a force F1 parallel to the rear face 35 of the mold 30, in order to drive a relative displacement between the base 31 of the mold 30 and the intermediate substrate 50, while the distal end 312 of the reliefs 310 remains in contact with the intermediate substrate 50. The latter therefore constitutes an anchoring point from which the reliefs 310 will be deformed. Thus, at the distal end 312 of the reliefs 310, the face 53 of the intermediate substrate 50 applies on the latter a reaction force R. This force F1 is parallel to the rear face 35 of the mold 30 i.e. parallel to the plane z1x1.

a force F2 normal to the rear face 35 of the mold 30 and of the intermediate substrate 50. More generally, the force F2 is applied parallel to the main direction according to which the reliefs extend in the plane x1y1 before the step of laying. This force F2 is preferably applied in such a way as to allow for a conformal contact, i.e. a contact and a homogeneous contact force on all the reliefs 310. It is also the controlling of this force F2 which makes it possible to ensure the anchoring of the distal ends 312 of the reliefs 310 on the intermediate substrate 50. This force F2 is perpendicular to the plane z1x1.

Preferably, the force F2 is applied simultaneously with the force F1. In this case, it can be provided that a same actuator applies a strength that has at least the components F1 and F2.

Figure 11B:
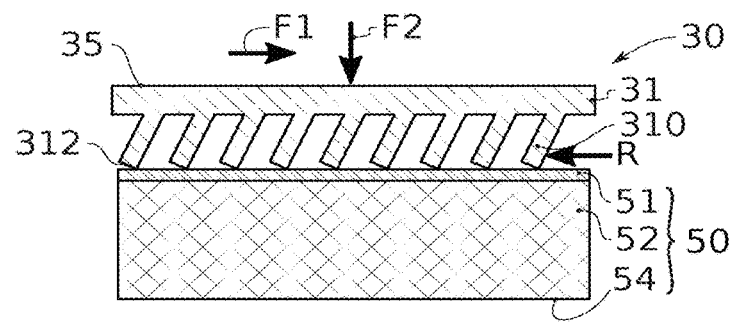

FIG. 11B shows the reliefs 310 in the process of deformation.

Figure 11C:
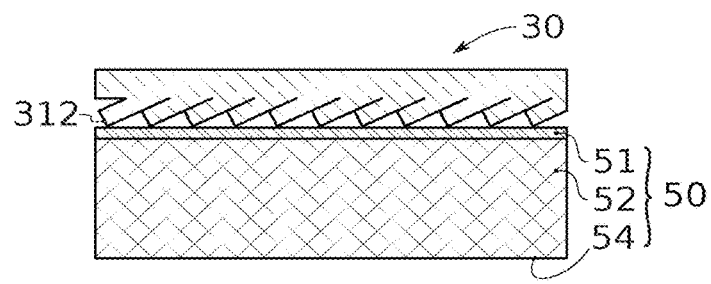

FIG. 11C shows the reliefs when the reliefs 310 are completely collapsed on one another.

Preferably, the face 53 of the intermediate substrate 50 is rigid. Also preferably, it has little or no adherence with the organic material used for the manufacture of the mold 30.

For this purpose, it can be provided that the intermediate substrate 50 comprises or is formed from a base substrate 52 covered with an anti-adhesive film 51. This film 51 has a friction coefficient less than or equal to 0.01. It is for example formed from a fluorinated organic material.

According to an example, this intermediate substrate 50 is transparent so that the collapsing of reliefs 310 can be optically followed up via its rear face 54. For example, the intermediate substrate 50 is formed or comprises a base substrate 52 formed from a silicon or glass part (wafer).

Once the collapsing of the reliefs 310 is obtained, the mold 30 is detached from the intermediate substrate 50.

Figure 11D:
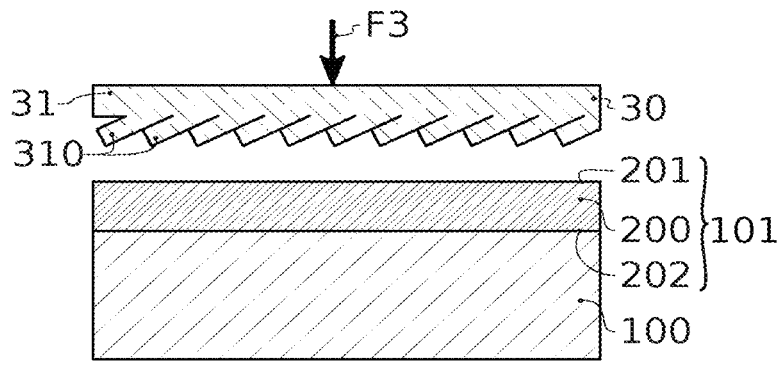
Figure 11E:
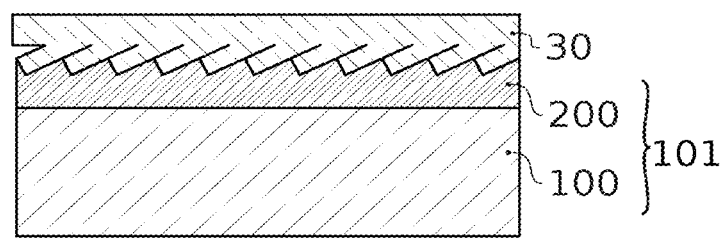
Figure 11F:
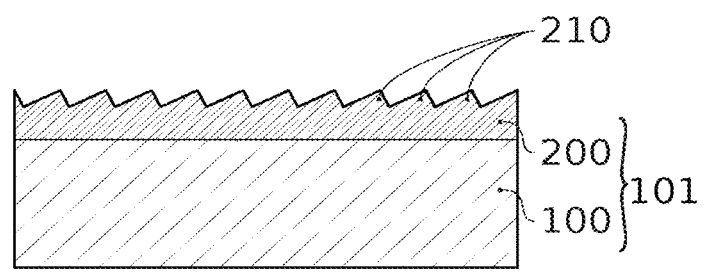

The mold 30 is then used to print a layer 200 of resin deposited on another stack 101 by using the printing methods well known to those skilled in the art (e.g., thermal printing or assisted by UV). These steps are shown in FIGS. 11D and 11E. FIG. 11F shows the result obtained at the end of printing the layer 200 of resin 210. The latter has patterns 210 inverse of the reliefs 310 of the mold 30.

This first approach with the use of an intermediate substrate 50 offers very good control of the method and in particular of the progressive inclination of the reliefs 310.

A second approach, shown in reference to FIGS. 12A to 12E shall now be described. This second approach provides to initiate the collapsing of the reliefs 310 during the filling phase of the mold 30, i.e. when the reliefs 310 have already at least in part penetrated into the layer 200 to be printed.

This second approach has for advantage to favour the collapsing of the reliefs 310. Moreover, it makes it possible to reduce the number of steps and makes the method for production faster and less expensive.

Figure 12A:
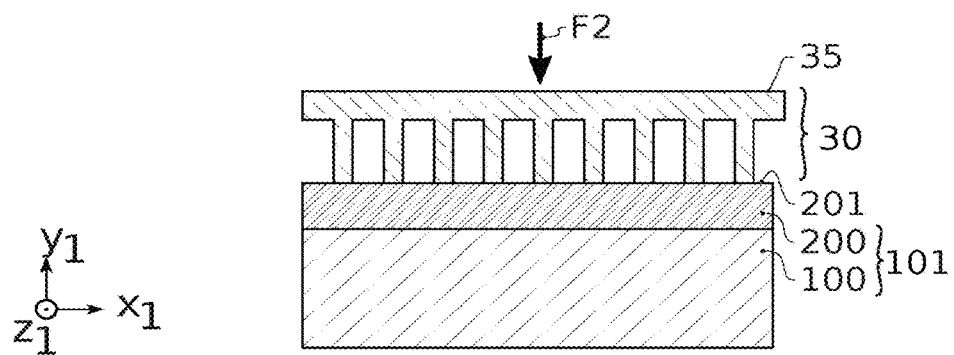
FIGS. 12A to 12E diagrammatically show steps of a second embodiment of a blazed grating.
Figure 12B:
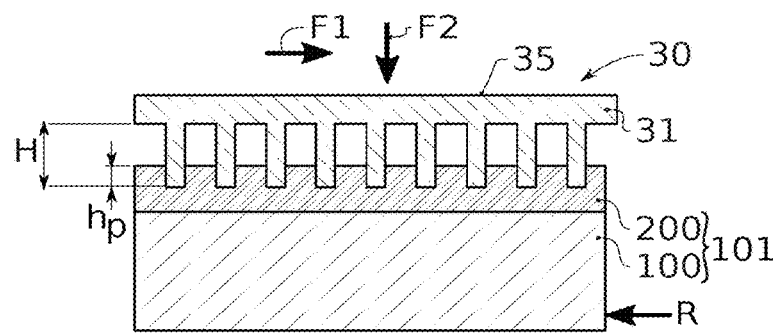

As shown in FIG. 12A, the reliefs 310 of the mold 30 are put into contact with the layer 200, typically a printable resin. A perpendicular force F2 is applied to the main plane z1x1 wherein the face 201 of the layer 200 extends. This force F2 has the reliefs 310 of the mold 30 penetrate into the layer 200 as shown in FIG. 12B. The distal ends of the reliefs 310 are then anchored in this layer 200. A parallel force F1 is applied to the plane of the face 201 on one among the mold 30 or the substrate 101 and an opposite force, for example a reaction strength, on the other among the mold 30 or the substrate 101. This reaction strength is for example generated by a maintaining equipment. Preferably, the force F1 is preferably applied on the base 31 of the mold 30 and the reaction strength R is applied on the stack 101.

Figure 12C:
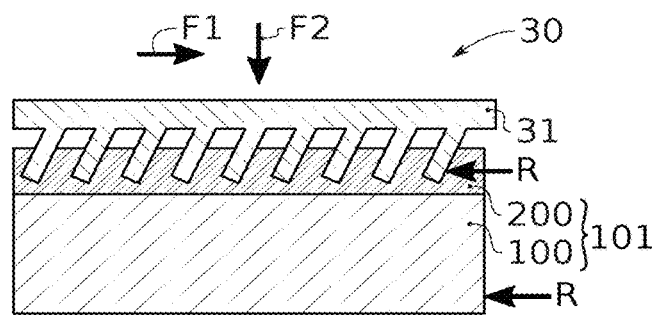
Figure 12D:
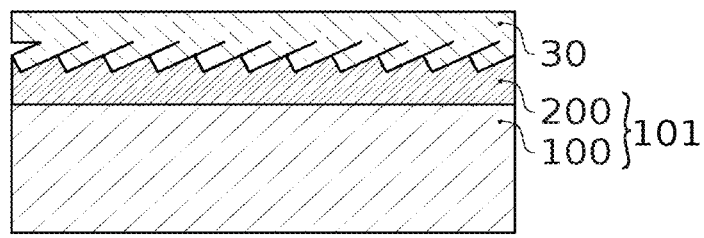
Figure 12E:
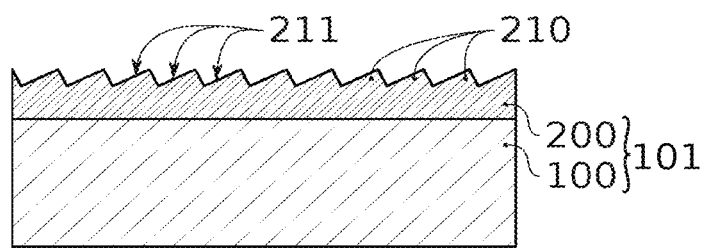
Figure 13A:
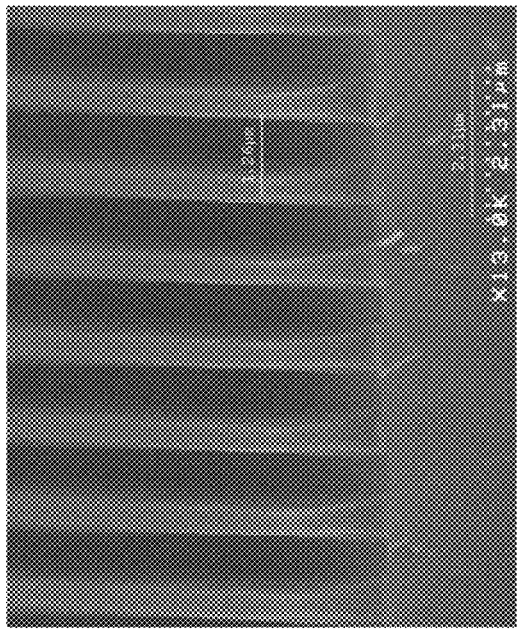
FIGS. 13A and 13B are electron microscopy images of a master, that has a grating of lines and intended for producing a mold. The image of FIG. 13B is an enlargement of the image of FIG. 13A.
Figure 13B:
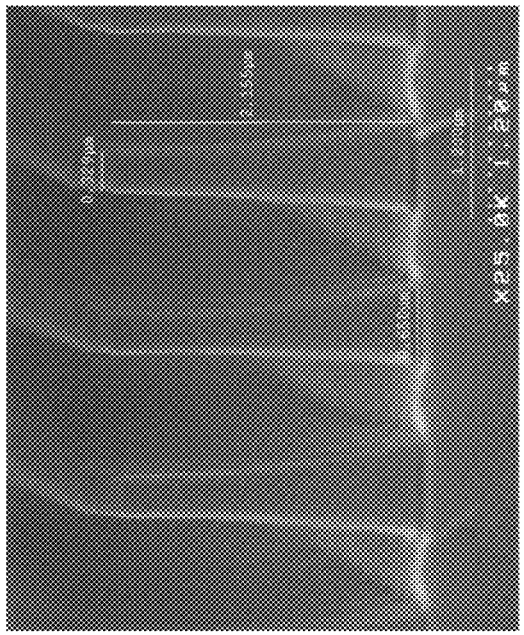

This force F1 and the opposite force thereof cause a relative displacement between the base 31 of the mold 30 and the end of the reliefs 312 trapped in the layer 100. This results in a deformation of the reliefs 310 that are laid on one another as shown in FIGS. 12C and 12D.

According to an example, the force F2 is applied simultaneously with the force F1. In this case, it can be provided that a same actuator applies a strength that has at least the components F1 and F2. According to an alternative embodiment, the force F1 is applied after suppression of the component F2 and after anchorage of the distal end 312 of the reliefs within the layer 200.

The layer 200 is preferably stabilised by ultraviolet and/or thermally.

The mold 30 is then removed from the layer 200. On a layer 200 patterns 210 are then obtained that each have a slanted flank.

Preferably, the thickness of the layer 200 of resin is sufficiently substantial to allow for a complete filling of the cavities formed between the reliefs 310 of the flexible mold 30.

Preferably, in this embodiment, the collapsing of the reliefs 310 is initiated after having had a sufficient portion of their total height H penetrate into the layer 200. If hp is the portion of height inserted into the layer 200 before starting the collapsing, the following relationship $1\%*H \leq hp \leq 15\%*H$ and $3\%*H \leq hp \leq 10\%*H$. is preferably respected.

Moreover, preferably $1 \leq hp \leq 20$ nm (10-9 metres) and preferably $1 \leq hp \leq 10$ nm (10-9 metres).

This makes it possible to ensure a good anchoring of the distal end 312 of the reliefs 310 while still authorising good control of the deformation of the reliefs 310.

For each one of the embodiments described hereinabove, it is provided that the mold 30 be provided with an anti-adhesive coating so as to facilitate demolding. Preferably this anti-adhesive treatment is in the form of a coating that covers at the very least the reliefs 310 of the mold 30.

This treatment makes it possible to significantly reduce the risks of adhesion of the reliefs of the mold on the layer 200.

This treatment is particular advantageous if the surfaces of the mold and of the layer 200 have close or identical materials such as mineral or organic materials. Moreover, this anti-adhesive coating is all the more so important in the embodiment described in reference to FIGS. 12A to 12D for preventing the resin of the layer 200 from remaining trapped between the reliefs 310 during the collapsing of the latter.

This anti-adhesive treatment is for example carried out by deposition of a film, for example a single-layer, in vapour phase or via centrifugation (spin coating).

According to a third approach, the collapsing of the reliefs is obtained by application of a stream on the reliefs 310 of the mold 30. Thus the contact force mentioned in the preceding embodiments is replaced with a physical non-contact force that is exerted directly on the reliefs. Thus, the stress exerted on the reliefs of the mold can be a contact force or a non-contact force. The stream can be a stream of compressed gas such as for example air or nitrogen. Alternatively, the stream can be a stream of liquid under pressure. It can then be water or a liquid that is neutral for the resin i.e. that does not dissolve the reliefs formed. The stream can have the form of a beam or of a web, such as shown by numerical reference 5 in FIG. 18B.

By suppressing the physical contact, this embodiment makes it possible to reduce the risks of the appearance of defects potentially created during the process of laying and which are for example due to the presence of dust.

With a solution based on the application of a contact force on the reliefs intended to be deformed, if a particle is present on the object exerting the contact, then, the reliefs can be contaminated.

By using a pure fluid, i.e. without contaminating particles, the reliefs to be deformed are prevented from being contaminated.

Moreover, with respect to the embodiments described in reference to FIGS. 11A to 11O the risk of a defect caused by insufficient or inhomogeneous contact between the distal end 312 of the reliefs 310 and the intermediate substrate 50 is reduced.

First Embodiment

A first embodiment, non-limiting, shall now be described in reference to FIGS. 13A to 14B.

A first step consists of manufacturing a master structure. This master is realised in a silicon substrate by using the structuring methods of micro-technologies and nanotechnologies, for example optical lithography and etching and dry plasma etching. This master has a grating of lines such as it appears in the images of FIGS. 13A and 13B.

The dimensions of the grating of lines are as follows:
L=329 nm
S=931 nm
P=1.26 µm
H=2.155 µm The inverse of the reliefs of this master are then transferred in a mold by applying a hot thermal printing method.

The mold is carried out from a deformable layer, 250 µm thick, made of COC (cycloolefin copolymer).

The hot thermal printing is carried out at a temperature of 160° C. for 5 minutes with a pressure of 20 bars. Once the assembly, master and layer of COC cooled to a temperature less than 60° C., they are separated.

The mold thus formed is then used to print a layer 200 made from a film of resin. The resin is for example the resin MRL 6000 manufactured by the company Micro Resist Technology™. The layer 200 has a thickness of 2.0 µm. It is deposited via centrifugation on a silicon substrate 100. The layer 200 and the substrate 100 form a plate or stack 101.

The mold, preferably, for example flexible, is laminated on the plate with a silicone roller. This step of lamination can be carried out manually. This step makes it possible to put the mold 30 in contact with the surface of the viscous resin at ambient temperature. The effect of the laminating makes it possible to exert the force F1 parallel to the surface 201 of the layer 200 of resin and of the plane defined by the peaks 315 of the reliefs 310 of the mold 30 then in contact with the upper face 201 of the layer 200 of resin, which makes it possible to carry out the collapsing of the reliefs. The printing is then finalised by heating the resin to 50° C. and with a UV insolation (wavelength 365 nm) of a power of 50 mW/cm² for 30 seconds (flash UV) and under a normal pressure at the surfaces 201, 35 of 6 bars. Then the mold 30 is separated from the layer 200 of resin thus formed.

Figure 14A:
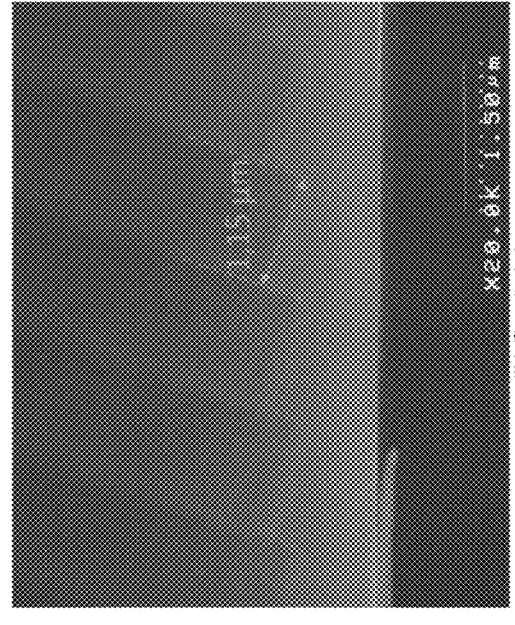
FIGS. 14A and 14B are electron microscopy images of a resin wherein slanted patterns have been transferred by nanoprinting.
Figure 14B:
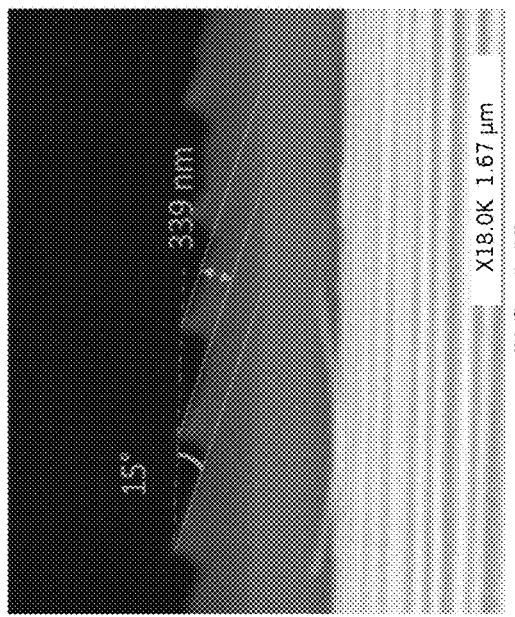

To obtain the images of FIGS. 14A and 14B, the stack 101 thus obtained was cleaved in order to allow for an observation under the scanning electron microscope.

Using again the rules of the drawings disclosed hereinabove the angle of the blazed grating can be determined.

$$\cos(90 - \alpha) = 1 - \frac{S}{P}$$

$$\sin(\alpha) = 1 - \frac{931}{1260} = 0.2611$$

$$\alpha = 15.13°$$

On the measurements taken on the example an angle of 15° is determined in accordance with the rules of the drawing. Regarding the value of p the following equations are applied:

$$p = \frac{L}{\tan(\alpha)}$$

$$p = \frac{329}{\tan(15.13)} = 1216 \text{ nm}$$

This calculated value of p is very close to the measured value, which confirms the validity of the established drawing rules. It can however be noted that the initial height of the reliefs on the master (2.155 µm) is much higher than the theoretical value of p, 1.216 µm, which allows for the contact of neighbouring lines. Moreover as the form ratio H/L is 6.55, the collapsing of the lines is relatively easy.

In this present case, the flexible mold was carried out in a polymer with an acrylate base and the printed resin is formulated on an epoxy base. This material family pair is therefore particularly well suited for implementing the proposed method.

Other Embodiments

This section presents different gratings of trenches that were manufactured in a silicon plate. These trenches have an etching depth of 800 nm. These gratings of trenches differ by their period. Thus the trench density is comprised between 0.43 and 0.5

| Grating | C1 | C2 | C3 | C4 |
|---|---|---|---|---|
| Trench width L (nm) | 265 | 276 | 262 | 271 |
| Period P (nm) | 545 | 602 | 589 | 627 |
| Ratio L/P | 0.49 | 0.46 | 0.458 | 0.432 |

Figure 15A:
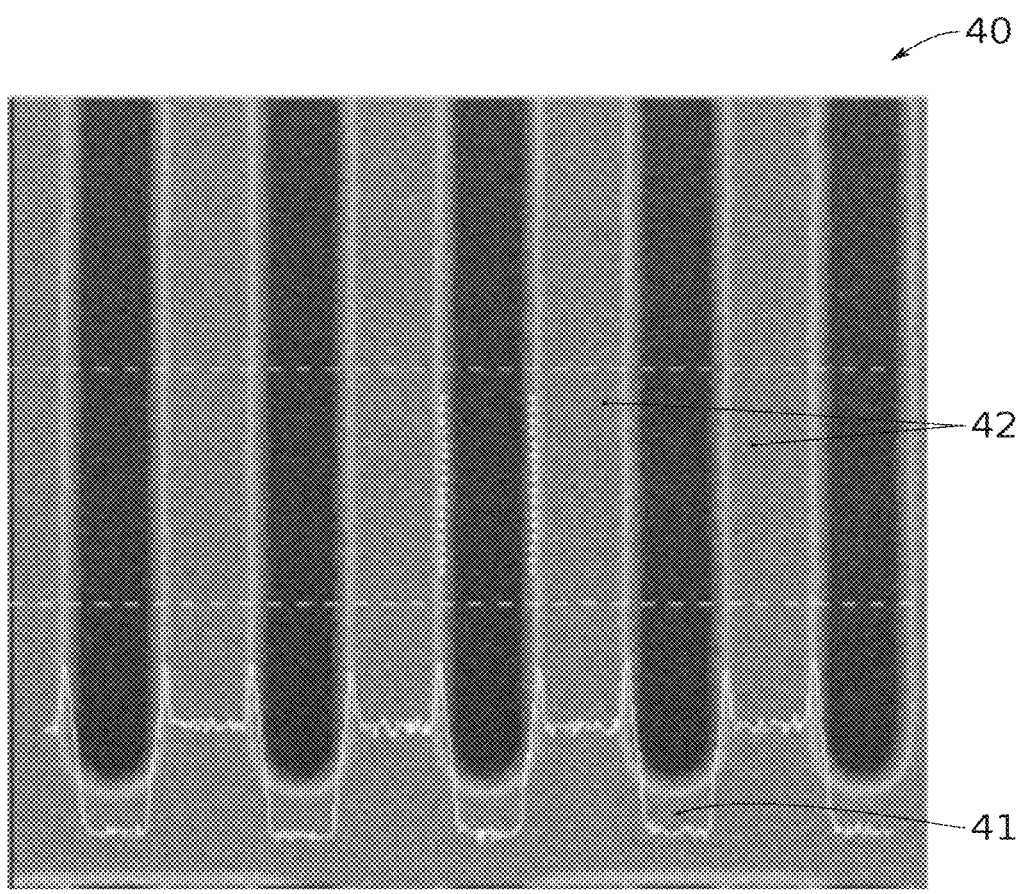
FIG. 15A is an electron microscopy image of a master, that has a grating of lines and intended for producing a mold.

FIG. 15A is an electron microscopy image of an example of a master that has a grating of reliefs.

Figure 15B:
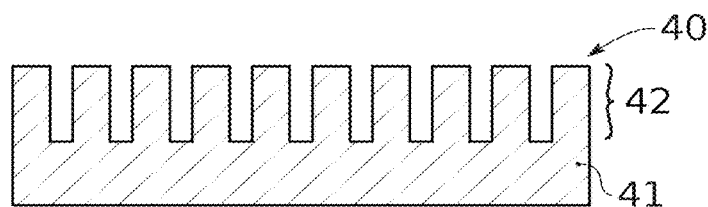
FIGS. 15B to 15G diagrammatically show steps of an embodiment of a mold that has a blazed grating, this mold is obtained starting with a master of which the photo of FIG. 15A is taken. These figures also show the production, by nanoprinting from the mold, of a grating of slanted patterns in a layer of resin then the transfer thereof in a substrate.
Figure 15C:
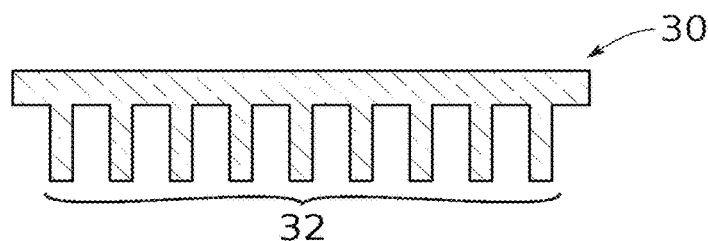
Figure 15D:
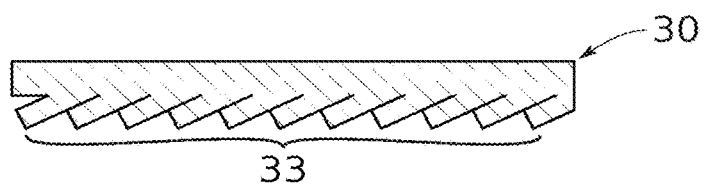
Figure 15E:
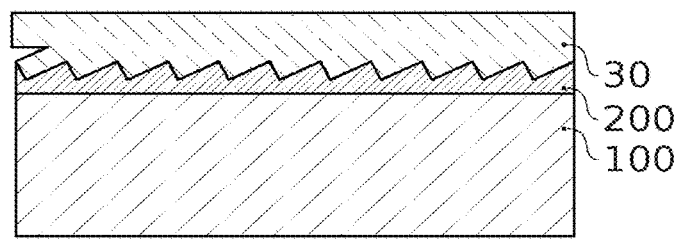
Figure 15F:
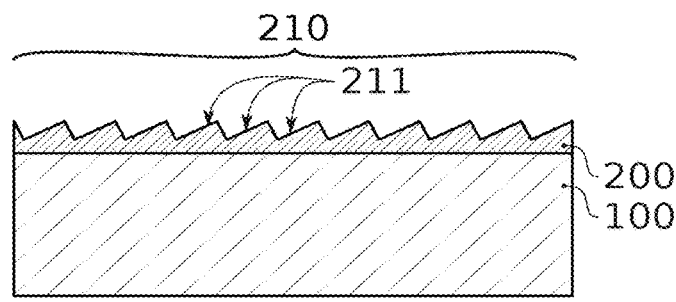
Figure 15G:
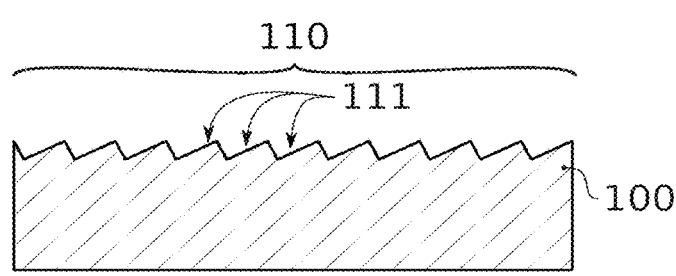

For each grating manufactured, the steps shown in FIG. 15B to 15G are carried out. These steps were described in detail in the preceding description and are very briefly recalled hereinbelow:

FIG. 15B shows the master 40 and its grating 42 of reliefs. FIG. 15C shows the mold 30 obtained from the master 40. FIG. 15D shows the mold 30 after collapsing of the reliefs 310 of the grating 32 in order to form a grating 33 of slanted reliefs. FIG. 15E shows the printing of the mold 30 in the layer 200 of resin. FIG. 15F shows the grating of patterns 210 obtained in the layer 200 after removal of the mold 30. Each pattern 210 has a slanted flank 211. FIG. 15G shows the result obtained after transfer of the patterns 210 of the resin in a substrate 100 underlying the layer 200.

Figure 16:
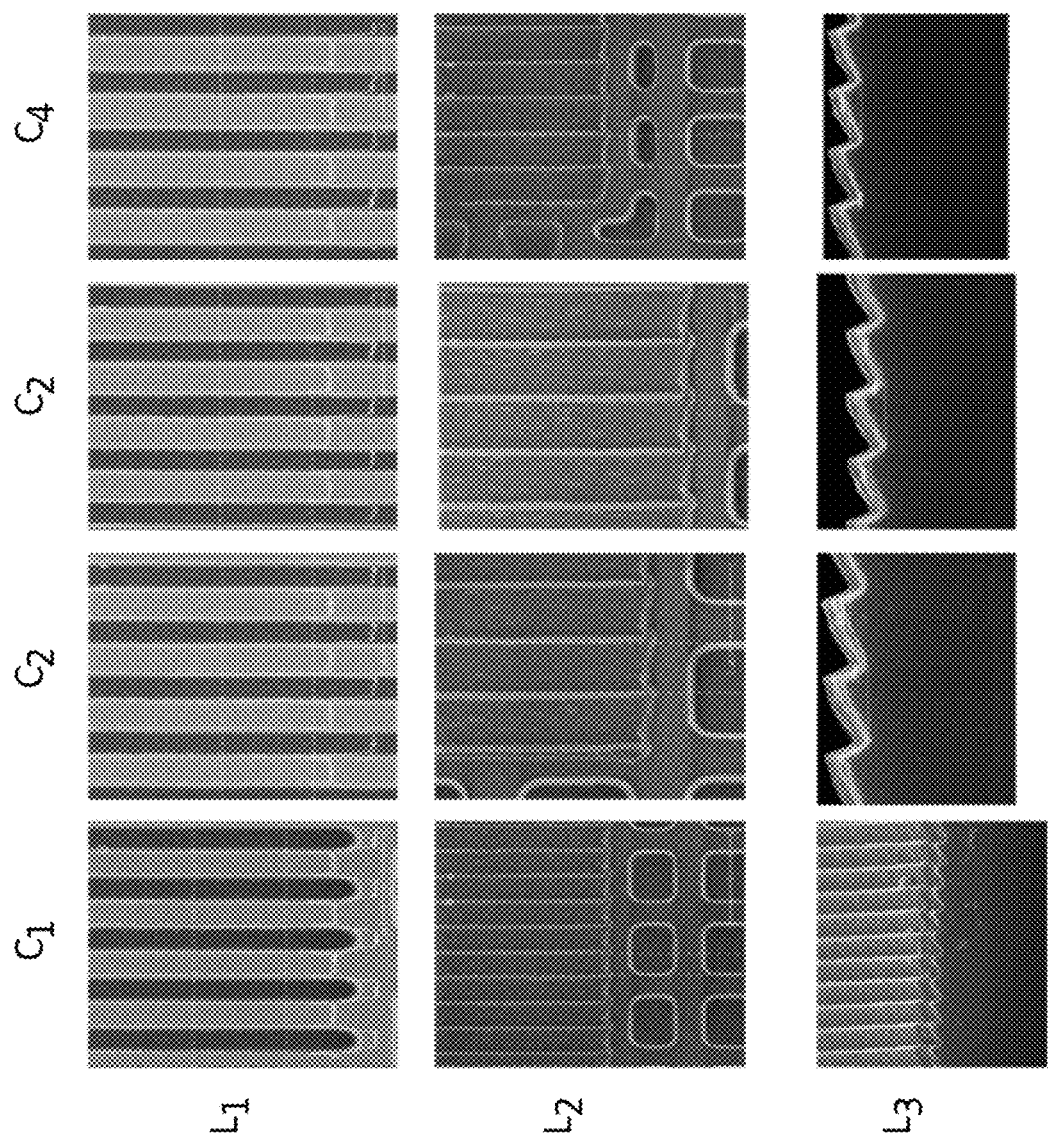
FIG. 16 comprises several images taken with electron microscopy and showing four types of gratings of reliefs carried out in masters (line L1 of figures). The line L2 of the images are the images seen from above of gratings of patterns obtained in a resin by printing of molds manufactured from masters of the line L1. The line L3 of images corresponds to the crops-section views of the gratings of patterns shown in the images of the line L2.
Figure 17:
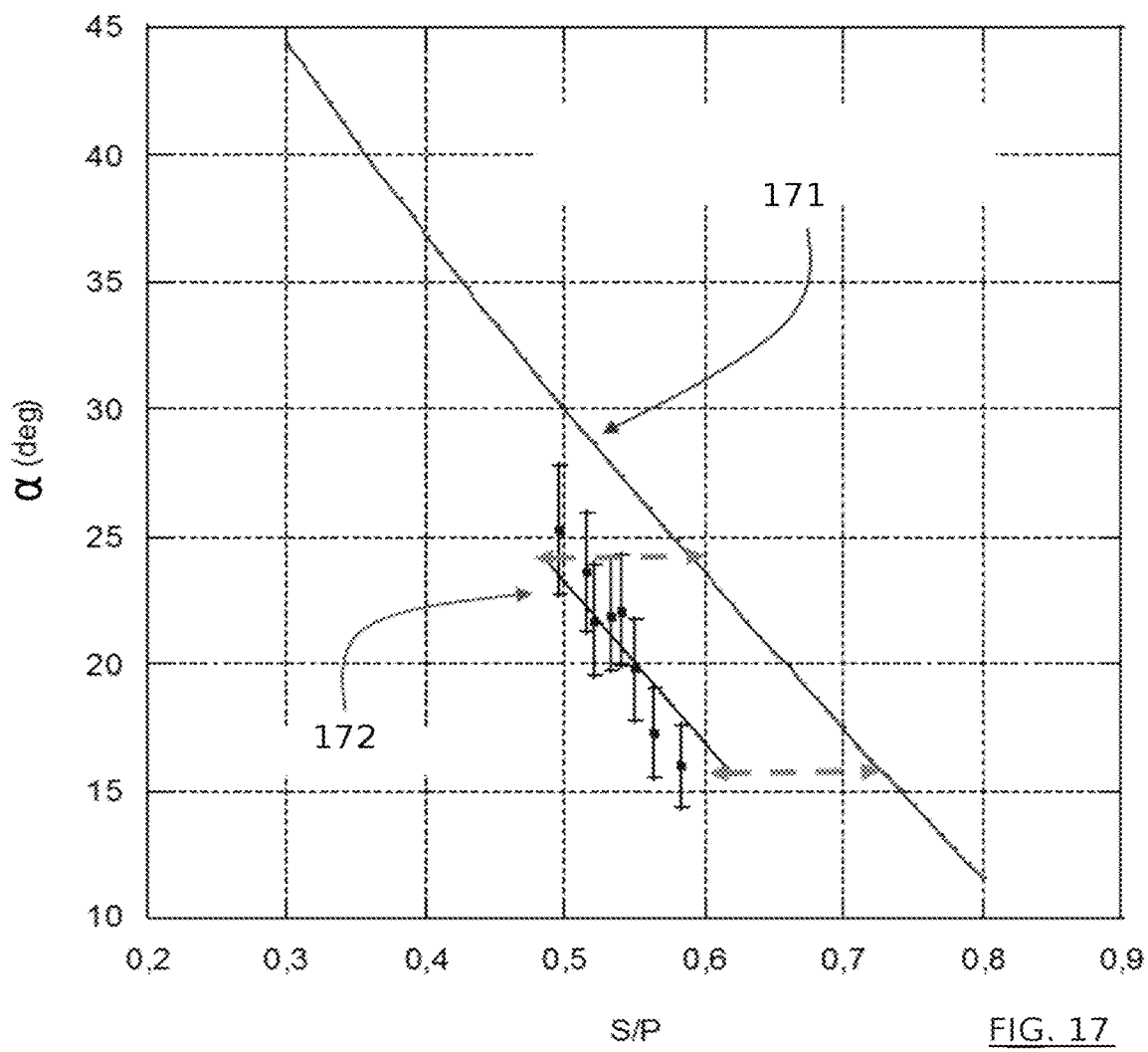
FIG. 17 is a graph showing the constant offset that can appear between the expected angle with the geometries imposed on the masters and the angle that is actually measured in the grating formed by the mold.

FIG. 16 groups together images obtained with the electron microscope by implementing the method shown in FIGS. 15B to 15F. The images of columns C1 to C4 correspond to the different gratings mentioned in the table hereinabove. The images of lines L1 to L3 correspond to the images obtained by electron microscopy respectively:

as a top view of the masters,
as a top view of the blazed gratings printed in the layer of resin,
as a cross-section view of the blazed gratings printed in the layer of resin.

From the images of this FIG. 16, it can be observed that blazed gratings for all these configurations are indeed obtained. According to the geometries imposed by the master it is possible to obtain different angles of blazed gratings.

It will be noticed that there can be a constant offset between the expected angle with the geometries imposed on the masters and the measured angle. This constant offset appears clearly on the graph of FIG. 17. On this graph the curve 171 represents the expected angles with the geometry (design) imposed on the master. The curve 172 represents the angles that are actually obtained in the mold and the layer of resin.

This offset is linked to the properties of the materials used. Indeed, under UV exposure these materials undergo a certain shrinking which affects the dimensions of the reliefs present on the mold and therefore modifies the value of the ratio S/P. This results in a constant offset. It is therefore advantageous, according to the materials used to generate the flexible mold whereon the reliefs will be collapsed to pass through a step of calibration. This step of calibrating aims to take account of this variation in geometry on the structures obtained, then to correct the initial geometry (design) imposed on the master.

Alternative Embodiments

The method described hereinabove also applies to the production of a microelectronic device 30' that has a grating 33' of slanted reliefs that is not obtained from a nanoprinting method and/or which is not intended to form a mold for nanoprinting.

Indeed, the microelectronic device 30', in particular its initial grating 32' of reliefs 310' can be obtained from any one of the microelectronic techniques and in particular optical lithography (in particular photolithography) or electronic lithography (in particular electron beam lithography) without being limited to nanoprinting.

Moreover, the microelectronic device 30' can form a layer of resin carrying patterns that will be transferred in a functional layer, for example by etching, not by nanoprinting.

Furthermore, the microelectronic device 30' can form a functional device, i.e. a device that has at least one mechanical, or optical function.

Figure 18A:
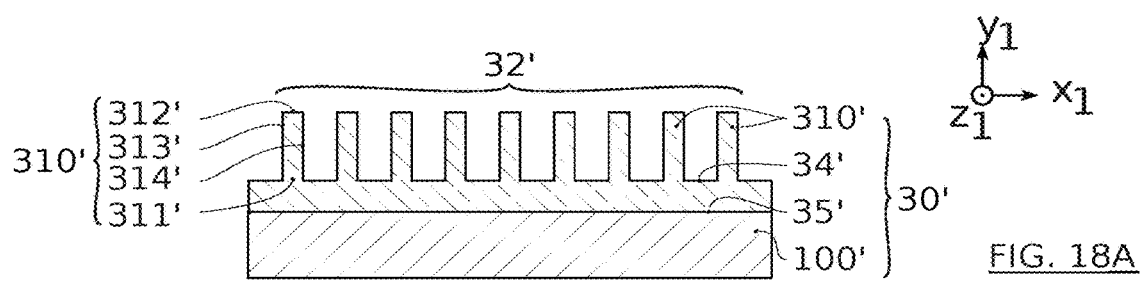
FIGS. 18A and 18B diagrammatically show steps of an example of manufacturing a microelectronic device, comprising for example a substrate overmounted with a layer of resin, and wherein a grating of slanted reliefs is produced in the resin.

FIG. 18A shows a structure 30' comprising a substrate 100' overmounted by a layer wherein are formed reliefs 310' organized in the form of an initial grating 32'. All the elements of this FIG. 18A correspond to the elements bearing numerical references of the same number in the preceding figures.

Figure 18B:
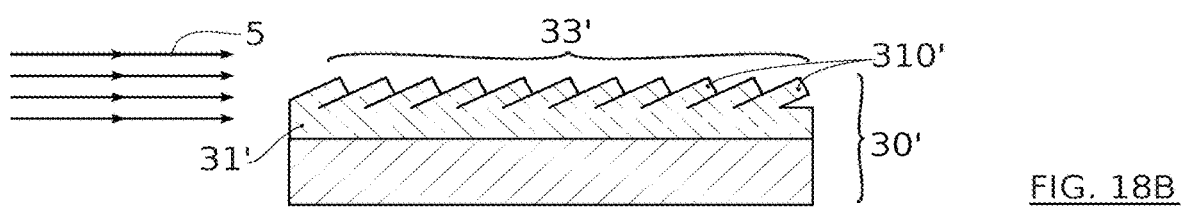

As shown in FIG. 18B, a step of laying of the reliefs 310' is then carried out in order to obtain a subsequent grating 33' that has slanted reliefs 310'.

This step of laying can for example be obtained by implementing the method shown in FIG. 11A to 11C which provides for the application of a contact force on an intermediate substrate 50. This step of laying can also be obtained by applying a stream 5 of fluid on the reliefs 310' such as described hereinabove.

All the characteristics and all the technical effects mentioned hereinabove in reference to the production of a mold 30 for nanoprinting can be transposed to this embodiment of a microelectronic device 30'.

The microelectronic device 30' thus obtained can be used for the transfer of the grating 33' in another substrate, for example by etching. Alternatively, the microelectronic device 30' can form a mold for nanoprinting.

The invention is not limited to the embodiments described hereinabove and extends to all the embodiments covered by the claims.

In particular, the method proposed can be implemented on the reliefs or patterns that are not in one dimension (grating of lines or of studs) as in the non-limiting examples presented hereinabove. The reliefs or patterns can also have more complex forms and in particular three-dimensional forms i.e. have several levels of height. Blazed gratings with an organisation and complex forms can thus be created.

The invention claimed is:

1. A method for producing a microelectronic device having a subsequent grating of reliefs of which at least one wall is slanted, the method comprising:
    providing a structure comprising:
        a base, and
        an initial grating of reliefs, each relief having at least one proximal end in contact with the base, a distal end, and at least one wall extending between the proximal end and the distal end; and
    laying the reliefs of the initial grating on one another, by application of at least one stress on the structure, such that walls facing two adjacent reliefs come into contact, thus generating at least one subsequent grating of reliefs of which at least one wall is slanted.

2. The method according to claim 1, wherein the microelectronic device forms a mold for nanometric printing.

3. The method according to claim 1, wherein providing the structure comprises a step of nanoprinting for producing the initial grating of reliefs.

4. The method according to claim 1, wherein providing the structure comprises a step of optical or electronic lithography, for producing the initial grating of reliefs.

5. The method according to claim 1, wherein the at least one stress comprises or is a force taken from among a contact force and a non-contact force.

6. The method according to claim 1, wherein parameters of the initial grating, comprising in particular a form of the reliefs, a step of the initial grating and a material of the initial grating, are chosen such that after the laying of the reliefs, each relief has at least one wall slanted by an angle different from 90° with respect to a plane wherein a face of the base mainly extends.

7. The method according to claim 1, wherein the reliefs of the initial grating form, before the step of laying, at least one among:
    lines extending mainly in a direction parallel to a plane in which is mainly comprised a face of the base of the structure from which the reliefs extend, and
    studs with a polygonal or circular section, the section being taken according to the plane.

8. The method according to claim 1, wherein the laying the reliefs comprises applying at least one contact force on at least one among the base of the structure and the reliefs, and applying a complementary force or a reaction force on the other among the base of the structure and the reliefs, and so as to cause a relative displacement between the base of the structure and the reliefs.

9. The method according to claim 8, wherein the at least one contact force of the structure has:
    a component substantially parallel to a plane in which is mainly comprised a face of the base from which the reliefs extend, and
    a component substantially perpendicular to the plane.

10. The method according to claim 8, wherein the at least one contact force is applied on the base of the structure when the distal ends of the reliefs of the structure are in contact with an intermediate substrate, the intermediate substrate having a face configured to come into contact with distal ends of the reliefs.

11. The method according to claim 10, wherein the face comprises a film having a friction coefficient less than or equal to 0.01.

12. The method according to claim 1, wherein the laying the reliefs comprises applying a stream of fluid on the reliefs of the initial grating.

13. A method for producing at least one grating of slanted patterns on a layer, the method comprising:
    providing a mold for nanometric printing by implementing the method according to claim 2;
    having the subsequent grating of slanted reliefs penetrate into the layer in order to form on a first face of the layer a grating of patterns according to the slanted reliefs; and
    detaching the mold from the layer.

14. The method according to claim 13, wherein the patterns each have at least one flank slanted by an angle different from 90° with respect to a plane in which a second face of the layer extends mainly opposite the first face.

15. The method according to claim 13,
    wherein the laying the reliefs of the initial structure of the mold comprises applying at least one contact force on at least one among the base of the structure and the reliefs, and applying a complementary force or a reaction force on the other among the base of the structure and the reliefs and so as to cause a relative displacement between the base of the structure and the reliefs, and
    wherein the at least one contact force of the structure has:
        a component substantially parallel to a plane in which is mainly comprised a face of the base from which the reliefs extend, and
        a component substantially perpendicular to the plane.

16. The method according to claim 15, wherein the at least one contact force is applied on the base of the structure when the distal ends of the reliefs of the structure are in contact with an intermediate substrate, the intermediate substrate having a face configured to come into contact with distal ends of the reliefs.

17. The method according to claim 16, wherein the face comprises a film having a friction coefficient less than or equal to 0.01.

18. The method according to claim 15, wherein the at least one contact force is applied on the base of the mold after penetration of a portion at least of the initial grating of reliefs into the layer.

19. The method according to claim 18, wherein the at least one contact force is applied before a complete penetration of the reliefs of the mold into the layer.

20. The method according to claim 18, wherein:
the reliefs have, before laying, a height measured between the distal end of the reliefs and a face of the base of the mold from which the reliefs extend, and
the at least one contact force is applied on the base of the mold when a height of the reliefs having penetrated into the layer is comprised between 0.1 and 0.7 times the height measured of the reliefs.

21. The method according to claim 13, wherein the laying the reliefs of the initial grating of the mold comprises applying a stream of fluid on the reliefs of the mold.

22. The method according to claim 13, wherein the reliefs of the mold have a basic material and a coating that covers the basic material, the coating having a friction coefficient less than that of the basic material.

23. The method according to claim 13, further comprising, after having detached the mold from the layer, a step of transferring, via etching, of the grating of patterns in a substrate underlying the layer.

* * * * *